US012688893B2

(12) United States Patent
Jiang et al.

(10) Patent No.: US 12,688,893 B2
(45) Date of Patent: Jul. 21, 2026

(54) FLASH MEMORY CELL, WRITING METHOD AND ERASING METHOD THEREFOR

(71) Applicant: Beijing PXMicro Technology Co. Ltd., Beijing (CN)

(72) Inventors: Jiayong Jiang, Beijing (CN); Zhendong Shi, Beijing (CN)

(73) Assignee: Beijing PXMicro Technology Co. Ltd., Beijing (CN)

( * ) Notice: Subject to any disclaimer, the term of this patent is extended or adjusted under 35 U.S.C. 154(b) by 130 days.

(21) Appl. No.: 18/686,598

(22) PCT Filed: Aug. 25, 2022

(86) PCT No.: PCT/CN2022/114958

§ 371 (c)(1),
(2) Date: Feb. 26, 2024

(87) PCT Pub. No.: WO2023/025260

PCT Pub. Date: Mar. 2, 2023

(65) Prior Publication Data

US 2024/0355396 A1　　Oct. 24, 2024

(30) Foreign Application Priority Data

Aug. 26, 2021　(CN) .......................... 202110987914.1
Aug. 26, 2021　(CN) .......................... 202110987922.6
Aug. 26, 2021　(CN) .......................... 202110988483.0

(51) Int. Cl.
*G11C 16/14* (2006.01)
*G11C 16/04* (2006.01)
(Continued)

(52) U.S. Cl.
CPC .......... *G11C 16/14* (2013.01); *G11C 16/0483* (2013.01); *H10B 41/27* (2023.02); *H10D 30/0411* (2025.01); *H10D 30/68* (2025.01)

(58) Field of Classification Search
CPC . G11C 16/14; G11C 16/0483; G11C 16/0458; G11C 16/0475; G11C 16/10;
(Continued)

(56) References Cited

U.S. PATENT DOCUMENTS 5,414,693 A 5/1995 Ma et al.
5,661,054 A 8/1997 Kauffman et al.
(Continued)

FOREIGN PATENT DOCUMENTS

CN 1534769 10/2004
CN 1534769 A 10/2004
(Continued)

OTHER PUBLICATIONS

International Search Report mailed Nov. 16, 2022, in International Application No. PCT/CN2022/114958.
(Continued)

*Primary Examiner* — Michael T Tran
(74) *Attorney, Agent, or Firm* — Baker Botts L.L.P.

(57) ABSTRACT

Provided are a flash memory cell and associated manufacturing, writing, and erasing methods. The flash memory cell comprises a substrate with a deep well region and a well region on which a first and second storage transistor are provided to store separate data and a gating transistor provided horizontally between them to perform a gating operation. The three transistors are connected in series, with a source region of the first storage transistor and a drain region of the second storage transistor connected to separate electrodes of the flash memory cell. The storage transistors have a gate structure composed vertically of a channel (Continued)

S501 Forming STI, PW and first channel layer

S502 ONO/Poly1/HM deposition

S503 Forming first hard mask blocking portions, Poly1/ONO etching, first implantation S504 Gox/Poly2 deposition, Poly2 self-aligned etching S505 HM/Poly1/ONO self-aligned etching, second implantation S506 Forming vias/M1/V1/M2

500 region, a gate dielectric stack, a gate electrode, and a hard mask blocking portion. The writing method uses low operation power and fast programming to increase write throughput. The erasing method uses a combined tunneling mechanism to enable low operation power, fast erasing, and improved storage reliability.

20 Claims, 14 Drawing Sheets

(51) Int. Cl.
  *H10B 41/27*       (2023.01)
  *H10D 30/01*       (2025.01)
  *H10D 30/68*       (2025.01)

(58) Field of Classification Search
  CPC .... G11C 16/16; H10B 41/27; H10D 30/0411;
                                            H10D 30/68
  USPC ........................................ 365/185.01, 185.24
  See application file for complete search history.

(56)                References Cited

U.S. PATENT DOCUMENTS

| | | | | |
|---|---|---|---|---|
| 9,047,960 | B2 * | 6/2015 | Li | ......................... H10D 64/035 |
| 9,620,225 | B2 * | 4/2017 | Ashokkumar | ...... G11C 11/2275 |
| 10,147,501 | B1 * | 12/2018 | Ebsen | ..................... G06F 12/08 |
| 11,074,985 | B1 * | 7/2021 | Chern | .................... G11C 17/18 |
| 2002/0131291 | A1 | 9/2002 | Kurjanowicz et al. | |
| 2004/0140498 | A1 | 7/2004 | Hsieh | |
| 2004/0156234 | A1 | 8/2004 | Peng et al. | |
| 2004/0197995 | A1 | 10/2004 | Lee et al. | |
| 2005/0265068 | A1 | 12/2005 | Takemura et al. | |
| 2009/0108328 | A1 | 4/2009 | Widjaja et al. | |
| 2009/0201742 | A1 * | 8/2009 | Lee | .................... G11C 16/0441 |
| | | | | 257/E29.345 |
| 2010/0103744 | A1 | 4/2010 | Yang et al. | |
| 2010/0195404 | A1 * | 8/2010 | Lee | ..................... G11C 16/344 |
| | | | | 365/185.11 |
| 2011/0215395 | A1 | 9/2011 | Golubovic | |
| 2016/0093384 | A1 | 3/2016 | Lee | |
| 2018/0322927 | A1 | 11/2018 | Hu | |
| 2020/0202947 | A1 * | 6/2020 | Kim | .................... G11C 11/5642 |
| 2021/0134817 | A1 * | 5/2021 | Ning | .................. G11C 16/0441 |

FOREIGN PATENT DOCUMENTS

| | | | |
|---|---|---|---|
| CN | 1694242 | A | 11/2005 |
| CN | 1790722 | A | 6/2006 |
| CN | 1870297 | A | 11/2006 |
| CN | 101178935 | A | 5/2008 |
| CN | 101640205 | A | 2/2010 |
| CN | 102122662 | A | 7/2011 |
| CN | 102460402 | A | 5/2012 |
| CN | 102509727 | A | 6/2012 |
| CN | 102971799 | A | 3/2013 |
| CN | 102983139 | A | 3/2013 |
| CN | 103000218 | A | 3/2013 |
| CN | 103151356 | A | 6/2013 |
| CN | 103165621 | | 6/2013 |
| CN | 103165621 | A | 6/2013 |
| CN | 103456358 | A | 12/2013 |
| CN | 103681681 | | 3/2014 |
| CN | 103681681 | A | 3/2014 |
| CN | 103811065 | A | 5/2014 |
| CN | 103824593 | A | 5/2014 |
| CN | 104183274 | A | 12/2014 |
| CN | 104538398 | A | 4/2015 |
| CN | 104778972 | A | 7/2015 |
| CN | 105097037 | A | 11/2015 |
| CN | 105469823 | A | 4/2016 |
| CN | 106024799 | A | 10/2016 |
| CN | 107342290 | A | 11/2017 |
| CN | 107771348 | A | 3/2018 |
| CN | 108198818 | A | 6/2018 |
| CN | 108847266 | A | 11/2018 |
| CN | 110137173 | A | 8/2019 |
| CN | 112967745 | A | 6/2021 |
| CN | 113437080 | | 9/2021 |
| CN | 113437084 | | 9/2021 |
| CN | 113437085 | | 9/2021 |
| CN | 113658622 | | 11/2021 |

OTHER PUBLICATIONS

Collier et al., "A novel dual-gate high electron mobility transistor using a split-gate structure," Applied Physics Letters, 71(20):2958-2960 (1997).
Zhang et al., "A Four-State EEPROM Using Two-Transistor Cells," Microelectronics, 30(2):97-99 (2000) (with English abstract).
Zhang, "Improvement of erase performance of 70nm split-gate flash memory," Chinese Mater's Theses Full-text Database (Information Technology Compilation), 2015, 45 pgs. (with English abstract).

* cited by examiner

200, MC

S301

Forming STI, PW and first channel layer

S302

ONO/Poly1/HM deposition

S303

HM/Poly1/ONO etching, first implantation

S304

Gox/Poly2 deposition, Poly2 self-aligned etching

S305

HM/Poly1/ONO self-aligned etching, second implantation

S306

Forming vias/M1/V1/M2

300

S501

Forming STI, PW and first channel layer

S502

ONO/Poly1/HM deposition

S503

Forming first hard mask blocking portions,
Poly1/ONO etching, first implantation

S504

Gox/Poly2 deposition, Poly2 self-aligned etching

S505

HM/Poly1/ONO self-aligned etching, second
implantation

S506

Forming vias/M1/V1/M2

500

100, MC

100, MC

100, MC

100, MC

100, MC

100, MC

100, MC

100, MC

FLASH MEMORY CELL, WRITING METHOD AND ERASING METHOD THEREFOR

FIELD OF THE INVENTION

The present disclosure relates to the field of semiconductor technology, in particular, relates to a flash memory cell as well as a writing method and an erasing method of the flash memory cell.

BACKGROUND OF THE INVENTION

A flash memory is a non-volatile memory, that is, the data stored therein can not be lost under the condition of power-off. It is especially applicable to the fields of mobile communication and computer storage component, etc. Besides, some flash memories also possess high-density storage capacity, so that it is applicable to large-capacity removable storage medium, etc.

The conventional flash memory adopts a floating gate type cell structure. The floating gate type non-volatile memory is originated from the MIMIS (Metal-Insulator-Metal-Semiconductor) structure proposed by D.kahng and S.Sze in 1967. This structure adds a metal floating gate and an ultra-thin tunneling oxide layer on basis of the conventional MOSFET (Metal-Oxide-Semiconductor Field Effect Transistor) to store charges using the metal floating gate. Based on this, a concept of flash memory was first proposed by Masuoka et al. in 1984, which can achieve a high-speed erasing capability by section-wise erasing and bit-wise writing and eliminate the selection transistor required in the EEPROM (Erasable Programmable Read-Only Memory), so that the storage cell has a smaller size. Thereafter, the flash memory is quickly developed due to its high writing speed, high integration level and excellent performance. A flash memory cell with an ETOX (Electron Tunneling Oxide) structure was proposed by Intel Corp. in 1988, which becomes the basis of developing most floating gate type flash memory cell structures.

However, the floating gate type flash memory has the following disadvantages: the process is complicated; due to the floating gate structure in the flash memory cell, the vertical height of the gate structure is increased, which is not conducive to scaling down the process size and the cell area; at the same time, due to the conductivity of the floating gate, the stored charges can move freely in the floating gate, so that it is not conducive to raising the reliability of memory. To solve the problems of complex process and poor reliability of floating gate type flash memory, researchers have proposed a charge trap memory (CTM: Charge-Trapping-Memory), also referred to as SONOS (Silicon-Oxide-Nitride-Oxide-Silicon) flash memory. Based on this, a two-bit memory cell structure NROM (Nitride-Read-Only-Memory) was proposed by B. Eitan et al. in 2000. This cell structure utilizes the non-conductive property of insulating silicon nitride storage dielectric to respectively implement two storage bits at the source terminal and drain terminal of a storage transistor. However, this cell structure has the disadvantages that the two storage bits are mutually interfered, and its device size cannot be scaled down, etc.

However, the existing floating gate type ETOX flash memory and SONOS type NROM flash memory all have the problems of failure of process size scaling down, large cell area, large writing power consumption and large array area overhead, and can not realize high-density integration above Gb capacity.

With the rapid development of applications such as mobile smart terminals, wearable devices, smart sensor networks and the like, higher requirements are put forward for power consumption, storage capacity, and cost of the flash memory. Therefore, a flash memory technology with the advantages of low power consumption, small cell area, scalable process size, high array integration density, large capacity and the like is required.

SUMMARY OF THE INVENTION

The above information disclosed in the section "BACKGROUND OF THE INVENTION" is only used for the purpose of understanding the background of the inventive concept and therefore may contain information that does not constitute the prior art.

In order to solve the above problems existing in the prior art, the present disclosure proposes a flash memory cell as well as a manufacturing method, a writing method and an erasing method of the flash memory cell.

According to an aspect of the present disclosure, there is provided a flash memory cell comprising: a substrate including a deep well region and a well region disposed on the deep well region; a first storage transistor disposed on the well region and configured to store first data; a second storage transistor disposed on the well region and configured to store second data; and a selection transistor disposed between the first storage transistor and the second storage transistor in a horizontal direction on the well region, configured to isolate the first storage transistor and the second storage transistor and to perform a selection operation on the first storage transistor and the second storage transistor, wherein the first storage transistor, the selection transistor and the second storage transistor are sequentially connected in series, wherein a source region of the first storage transistor is connected to a first electrode of the flash memory cell, and a drain region of the second storage transistor is connected to a second electrode of the flash memory cell, and wherein the first storage transistor and the second storage transistor have a gate structure including a channel region, a gate dielectric stack, a gate electrode and a hard mask blocking portion sequentially disposed in a vertical direction, and the gate dielectric stack has a first oxide layer, a storage dielectric layer and a second oxide layer sequentially stacked in the vertical direction.

According to another aspect of the present disclosure, there is provided a manufacturing method of a flash memory cell, which comprises a first storage transistor, a selection transistor and a second storage transistor sequentially connected in series, comprising: forming a deep well region of a second doped type in a substrate, forming a well region of a first doped type on the deep well region, and forming a first channel layer for forming channel regions of the first storage transistor and the second storage transistor in the well region; forming a gate dielectric stack having a first oxide layer, a storage dielectric layer and a second oxide layer stacked sequentially in a vertical direction on the well region, and sequentially forming a first gate electrode layer for forming gate electrodes of the first storage transistor and the second storage transistor and a hard mask layer on the gate dielectric stack; etching the hard mask layer, the first gate electrode layer and the gate dielectric stack to expose a first portion of the first channel layer, and doping the first portion of the first channel layer to form a channel region of the selection transistor; forming a gate dielectric layer and a gate electrode of the selection transistor on the channel region of the selection transistor; etching the hard mask layer at opposite sides of the selection transistor to form hard mask blocking portions, self-aligned etching the first gate electrode layer and the gate dielectric stack using the hard mask blocking portions as a mask to expose a second portion of the first channel layer, and doping the second portion of the first channel layer to form a source region of the first storage transistor and a drain region of the second storage transistor; and forming a first electrode of the flash memory cell connected to the source region of the first storage transistor and a second electrode of the flash memory cell connected to the drain region of the second storage transistor.

According to yet another aspect of the present disclosure, there is provided a manufacturing method of a flash memory cell, which comprises a first storage transistor, a selection transistor and a second storage transistor sequentially connected in series, comprising: forming a deep well region of a second doped type in a substrate, forming a well region of a first doped type on the deep well region, and forming a first channel layer for forming channel regions of the first storage transistor and the second storage transistor in the well region; forming a gate dielectric stack having a first oxide layer, a storage dielectric layer and a second oxide layer stacked sequentially in a vertical direction on the well region, and sequentially forming a first gate electrode layer for forming gate electrodes of the first storage transistor and the second storage transistor and a hard mask layer on the gate dielectric stack; etching the hard mask layer to form first hard mask blocking portions, self-aligned etching the first gate electrode layer and the gate dielectric stack using the first hard mask blocking portions as a mask to expose a first portion of the first channel layer, and doping the first portion of the first channel layer to form a channel region of the selection transistor; forming a gate dielectric layer and a gate electrode of the selection transistor on the channel region of the selection transistor, the gate electrode of the selection transistor having eave portions extending above the gate electrode of the first storage transistor and the gate electrode of the second storage transistor in a horizontal direction; etching the hard mask layer at opposite sides of the selection transistor to form second hard mask blocking portions, self-aligned etching the first gate electrode layer and the gate dielectric stack using the second hard mask blocking portions as a mask to expose a second portion of the first channel layer, and doping the second portion of the first channel layer to form a source region of the first storage transistor and a drain region of the second storage transistor; and forming a first electrode of the flash memory cell connected to the source region of the first storage transistor and a second electrode of the flash memory cell connected to the drain region of the second storage transistor.

The flash memory cell according to the present disclosure has the technical advantages of low power consumption, small size and large capacity. The flash memory cell according to the present disclosure can achieve better process size scaling down and higher array integration density, and has lower cost compared with the prior art.

According to an aspect of the present disclosure, there is provided a writing method of a flash memory cell, which comprises: a substrate including a deep well region and a well region disposed on the deep well region; a first storage transistor disposed on the well region and configured to store first data; a second storage transistor disposed on the well region and configured to store second data; and a selection transistor disposed between the first storage transistor and the second storage transistor in a horizontal direction on the well region, configured to isolate the first storage transistor and the second storage transistor and to perform a selection operation on the first storage transistor and the second storage transistor, wherein the first storage transistor, the selection transistor and the second storage transistor are sequentially connected in series, and wherein a source region of the first storage transistor is connected to a first electrode of the flash memory cell, and a drain region of the second storage transistor is connected to a second electrode of the flash memory cell, the writing method comprising: performing a writing operation on the first storage transistor by applying a first writing voltage to the first electrode, applying a second writing voltage to the second electrode, applying a third writing voltage to a gate electrode of the first storage transistor, applying a fourth writing voltage to a gate electrode of the selection transistor, and applying a fifth writing voltage to a gate electrode of the second storage transistor; and performing a writing operation on the second storage transistor by applying the second writing voltage to the first electrode, applying the first writing voltage to the second electrode, applying the fifth writing voltage to the gate electrode of the first storage transistor, applying the fourth writing voltage to the gate electrode of the selection transistor, and applying the third writing voltage to the gate electrode of the second storage transistor, wherein the fourth writing voltage is equal to or lower than a first power voltage, the second writing voltage is equal to or higher than a second power voltage, the first writing voltage is higher than a preset voltage, and the third writing voltage is higher than the first writing voltage, wherein the first power voltage is higher than the second power voltage, wherein the preset voltage is predetermined based on a carrier barrier height at an interface between the substrate and gate dielectric stacks of the first storage transistor and the second storage transistor, wherein the first writing voltage, the fourth writing voltage, and the fifth writing voltage are higher than the second writing voltage, wherein the second writing voltage is connected to the second power voltage through a constant current load, and wherein, during a writing operation of the flash memory cell, the first writing voltage, the second writing voltage, the third writing voltage, the fourth writing voltage, and the fifth writing voltage turn on all the first storage transistor, the second storage transistor, and the selection transistor.

Compared with the conventional writing method, the writing method of the flash memory cell according to the present disclosure adopts a channel hot carrier injection mechanism with low gate voltage, so that the writing method has the advantages of low operation power consumption and high programming speed, and the data write-throughput of the entire memory can be increased by increasing the number of flash memory cells written in parallel.

According to an aspect of the present disclosure, there is provided an erasing method of a flash memory cell, which comprises: a substrate including a deep well region and a well region disposed on the deep well region; a first storage transistor disposed on the well region and configured to store first data; a second storage transistor disposed on the well region and configured to store second data; and a selection transistor disposed between the first storage transistor and the second storage transistor in a horizontal direction on the well region, configured to isolate the first storage transistor and the second storage transistor and to perform a selection operation on the first storage transistor and the second storage transistor, wherein the first storage transistor, the selection transistor and the second storage transistor are sequentially connected in series, and wherein a source region of the first storage transistor is connected to a first electrode of the flash memory cell, and a drain region of the second storage transistor is connected to a second electrode of the flash memory cell, the erasing method comprising a first erasing step, which comprises: performing an erasing operation on the first storage transistor by applying a second power voltage to the well region, applying a first erasing voltage to the first electrode, applying the second power voltage to or floating the second electrode, applying a second erasing voltage to a gate electrode of the first storage transistor, by applying a third erasing voltage to a gate electrode of the selection transistor, and applying the second power voltage to or floating a gate electrode of the second storage transistor; and performing an erasing operation on the second storage transistor by applying the second power voltage to the well region, applying the second power voltage to or floating the first electrode, applying the first erasing voltage to the second electrode, applying the second power voltage to or floating the gate electrode of the first storage transistor, applying the third erasing voltage to the gate electrode of the selection transistor, and applying the second erasing voltage to the gate electrode of the second storage transistor, wherein the first erasing voltage is higher than a preset voltage, the second erasing voltage is equal to or lower than the second power voltage, and the third erasing voltage is equal to or lower than the second power voltage, and wherein the preset voltage is predetermined based on a carrier barrier height at an interface between the substrate and gate dielectric stacks of the first storage transistor and the second storage transistor.

The erasing method of the flash memory cell according to the present disclosure can improve the erasing operation speed of the flash memory cell and improve the erasing operation threshold voltage window and the memory reliability of the flash memory cell.

However, the effects of the present disclosure are not limited to the above-described effects, and various extensions can be made without departing from the spirit and scope of the present disclosure. It should be understood that both the aforementioned general description and the following detailed description are exemplary and illustrative, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the concept of the invention.

EMBODIMENTS OF THE INVENTION

Figure 1:
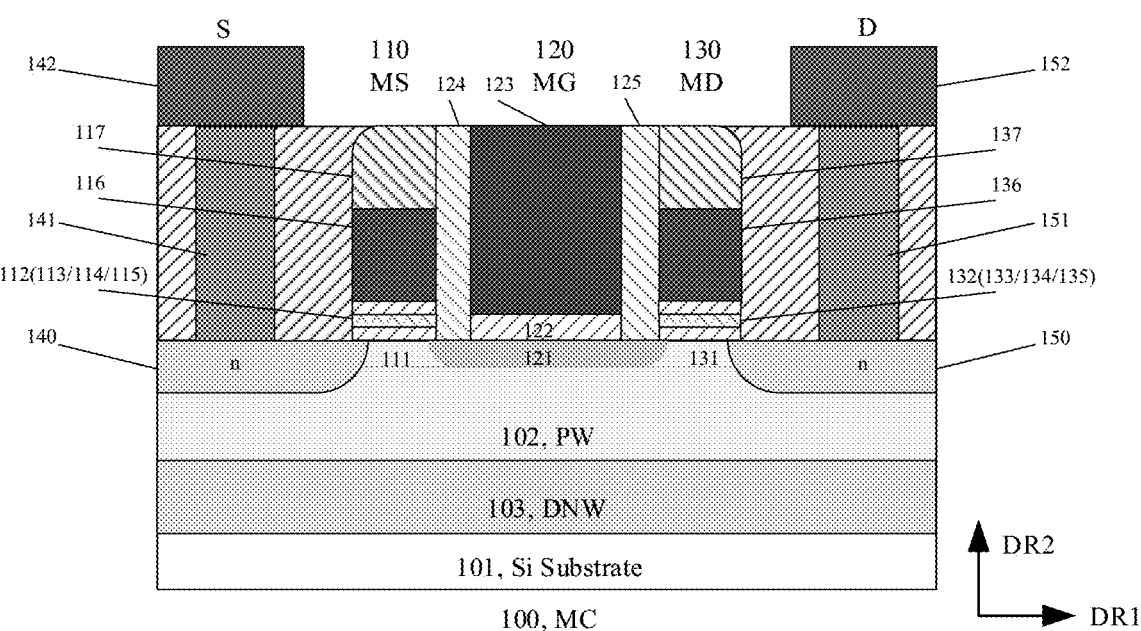
FIG. 1 illustrates a cross-sectional view of a flash memory cell according to a first embodiment of the present disclosure.

In the following description, for the purpose of explanation, many specific details are set forth in order to provide a thorough understanding of exemplary embodiments or implementations of the present invention. As used herein, "embodiment" and "implementation" are interchangeable words, and are non-limiting examples of the device or method employing one or more of the inventive concepts disclosed herein. However, it is obvious that the exemplary embodiments may be embodied without these specific details or with one or more equivalent arrangements. In other instances, well-known structures and devices are shown in block diagram in order to avoid unnecessarily obscuring the exemplary embodiments. In addition, the exemplary embodiments may be different, but need not be exclusive. For example, certain shapes, configurations, and characteristics of the exemplary embodiments may be used or implemented in other exemplary embodiments without departing from the spirit of the present invention.

Unless otherwise stated, the illustrated exemplary embodiments should be understood to provide exemplary features with varying details of some of the ways in which the inventive concepts may be practiced. Therefore, unless otherwise stated, features, components, modules, layers, films, panels, regions and/or aspects, etc. (hereinafter individually or collectively referred to as "elements") of various embodiments may be additionally combined, separated, interchanged and/or rearranged without departing from the concepts of the invention.

The cross-hatching and/or shading used in the drawings is generally provided for clarifying the boundaries between adjacent elements. Thus, unless otherwise stated, the presence or absence of cross-hatching or shading does not convey or indicate any preference or requirement for certain materials, material characteristics, sizes, proportions, commonalities among the illustrated elements, and/or any other characteristics, attributes, shapes, etc. of the elements. In addition, in the drawings, for clarity and/or descriptive purpose, sizes and relative sizes of elements may be exaggerated. While exemplary embodiments may be variously implemented, a particular process order may be performed differently from the described order. For example, two consecutively described processes may be performed substantially simultaneously or in a reverse order to the described order. Likewise, like reference numerals designate like elements.

When an element, such as a layer, is referred to as being "on", "connected to" or "coupled to" another element or layer, it may be directly on, directly connected to or coupled to another element or layer, or there may be an intervening element or layer. However, when an element or layer is referred to as being "directly on", "directly connected to" or "directly coupled to" another element or layer, no intervening element or layer is present. As such, the term "connection" may refer to physical, electrical and/or fluidic connection with or without an intervening element. In addition, a D1 axis, a D2 axis, and a D3 axis are not limited to three axes of a rectangular coordinate system, such as x, y and z axes, and may be interpreted in a broader sense. For example, the D1 axis, D2 axis, and D3 axis may be perpendicular to each other, or may represent different directions that are not perpendicular to each other. For the purposes of the present disclosure, "at least one of X, Y, and Z" and "at least one selected from the group consisting of X, Y, and Z" may be interpreted as X only, Y only, Z only, or any combination of two or more of X, Y, and Z, such as, for example, XYZ, XYY, YZ, and ZZ. As used herein, the term "and/or" includes any and all combinations of one or more of related items listed.

Although the terms "first," "second," etc. may be used herein to describe various types of elements, these elements should not be limited by these terms. These terms are used to distinguish one element from another. Thus, a first element discussed below could be referred to as a second element without departing from the teaching of the present disclosure.

Spatial relational terms, such as "below", "under", "lower", "above", "on", "upper" and "side" (for example, on a "sidewall"), etc., may be used herein for the descriptive purpose, so as to describe the relationship between one element and another element as shown in the drawings. The spatial relational terms are intended to encompass different orientations of a device in use, operation, and/or manufacture in addition to the orientation shown in the drawings. For example, if the device in the drawings is reversed, an element described as being "below" or "under" another element or feature will be oriented "above" the another elements or feature. Therefore, the exemplary term "below" may encompass orientations of both above and below. Furthermore, the device may be otherwise oriented (for example, rotated 90 degrees or at other orientations) and thus the spatial relationship descriptors used herein are interpreted accordingly.

The terminology used herein is for the purpose of describing particular embodiments, and not intended to be limiting. As used herein, the singular forms "a", "an" and "the" are intended to also include the plural form, unless the context clearly indicates otherwise. In addition, the terms "comprises" and/or "comprising" when used herein specify the presence of stated features, integers, steps, operations, elements, components, and/or groups thereof, but does not exclude the presence or addition of one or more other features, integers, steps, operations, elements, components, and/or groups thereof. As used herein, the terms "substantially", "about" and other similar terms are used as terms of approximation rather than terms of degree, and are thus utilized to account for inherent deviations in measured, calculated and/or provided values as appreciated by those skilled in the art.

As usual in the art, some exemplary embodiments are described and illustrated in the accompanying drawings in terms of functional blocks, units and/or modules. It should be understood by those skilled in the art that these blocks, units and/or modules are physically implemented by electronic (or optical) circuits, such as logic circuits, discrete components, microprocessors, hardwired circuits, memory elements, wiring connections, etc. They may be formed using semiconductor-based fabrication techniques or other fabrication techniques. When implemented by microprocessors or other similar hardware, the blocks, units and/or modules may be written and controlled by using software (for example, microcode), to perform the various functions discussed herein, and may optionally be driven by firmware and/or software. It is also considered that each of the blocks, units and/or modules may be implemented by dedicated hardware, or implemented as combination of dedicated hardware that performs some functions with a processor that performs other operations (for example, one or more written microprocessors and related circuits). Furthermore, each of blocks, units, and/or modules of some exemplary embodiments may be physically divided into two or more interactive and discrete blocks, units, and/or modules, without departing from the scope of the inventive concept. The blocks, units and/or modules of some exemplary embodiments may be physically combined into more complex blocks, units and/or modules without departing from the scope of the inventive concept.

Embodiments are described herein with reference to cross-sectional and/or exploded views which are schematic diagrams of idealized embodiments and/or intermediate structures. As such, variations from the shapes illustrated as a result, for example, of manufacturing techniques and/or tolerances, are to be expected, and thus the embodiments disclosed herein are not necessarily construed as limited to the particular illustrated shapes of regions, but are to include deviations in shapes that result, for example, from manufacturing. In this way, the regions illustrated in the drawings may be schematic in nature and the shapes of these regions may not reflect the actual shapes of the regions of the device, and thus are not necessarily intended to be limiting.

Unless otherwise defined, all terms (including technical terms and scientific terms) used herein have the same meaning as those commonly understood by those skilled in the art to which the present disclosure belongs. Terms, such as those defined in commonly used dictionaries, should be interpreted as having a meaning that is consistent with their meaning in the context of the relevant art and will not be interpreted in an idealized or overly formal sense unless expressly defined herein.

FIG. 1 illustrates a cross-sectional view of a flash memory cell MC 100 according to a first embodiment of the present disclosure.

As shown in FIG. 1, the flash memory cell MC 100 according to the first embodiment of the present disclosure may include a substrate 101 including a deep well region DNW 103 of a second doping type and a well region PW 102 of a first doping type disposed on the deep well region DNW 103.

Although the first doping type is defined as P-type and the second doping type is defined as N-type in FIG. 1 as an example, those skilled in the art should appreciate that the present disclosure is not limited thereto, and the first doping type may also be N-type, and thus the second doping type may be P-type.

According to an embodiment of the present disclosure, the substrate 101 may be, for example, a silicon (Si) substrate.

Further, the flash memory cell MC 100 includes a first storage transistor MS 110, a selection transistor MG 120, and a second storage transistor MD 130 sequentially connected in series. The first storage transistor MS 110 may be disposed on the well region PW 102 and store first data DATA1. The second storage transistor MD 130 may be disposed on the well region PW 102 and store second data DATA2. The selection transistor MG 120 is disposed between the first storage transistor MS 110 and the second storage transistor MD 130 in a horizontal direction DR1 on the well region PW 102, to isolate the first storage transistor MS 110 and the second storage transistor MD 130 and to perform a selection operation on the first storage transistor MS 110 and the second storage transistor MD 130.

According to an embodiment of the present disclosure, the flash memory cell MC 100 includes two storage transistors MS 110 and MD 130, and thus the flash memory cell MC 100 can achieve a function of two-bit storage, that is, storing the first data DATA1 and the second data DATA2 at the same time.

In addition, as shown in FIG. 1, a source region of the first storage transistor MS 110 is connected to a first electrode S of the flash memory cell MC 100, which may also be referred to as a source S of the flash memory cell MC 100, while a drain region of the second storage transistor MD 130 is connected to a second electrode D of the flash memory cell MC 100, which may also be referred to as a drain D of the flash memory cell MC 100.

Those skilled in the art should appreciate that the source and drain of the flash memory cell are defined herein for facilitating description, however, the definitions of the source and drain of the flash memory cell are relative, and the terms "source" and "drain" are used interchangeably under different operating conditions.

In addition, as shown in FIG. 1, the first storage transistor MS 110 has a gate structure including a channel region 111, a gate dielectric stack 112, a gate electrode 116 and a hard mask blocking portion 117 sequentially disposed in a vertical direction DR2. The gate dielectric stack 112 has a first oxide layer 113, a storage dielectric layer 114 and a second oxide layer 115 sequentially stacked in the vertical direction DR2. The second storage transistor MD 130 has a gate structure including a channel region 131, a gate dielectric stack 132, a gate electrode 136 and a hard mask blocking portion 137 sequentially disposed in the vertical direction DR2. The gate dielectric stack 132 has a first oxide layer 133, a storage dielectric layer 134 and a second oxide layer 135 sequentially stacked in the vertical direction DR2.

According to an embodiment of the present disclosure, the flash memory cell MC 100 includes two storage transistors MS 110 and MD 130, and thus may implement the function of two-bit storage.

According to an embodiment of the present disclosure, as shown in FIG. 1, the flash memory cell MC 100 for two-bit storage may consist of three closely arranged transistors, that is, the selection transistor MG 120 located in the middle of the flash memory cell MC 100, the first storage transistor MS 110 located at the first end of the flash memory cell MC 100 and the second storage transistor MD 130 located at the second end of the flash memory cell MC 100.

As shown in FIG. 1, the flash memory cell MC 100 may be formed on the well region PW 102 within the semiconductor substrate 101. In addition, in order to isolate the well region PW 102 from the substrate 101 so as to apply a voltage to the well region PW 102 under certain operating conditions, the well region PW 102 may be formed in the deep well region DNW 103 as shown in FIG. 1.

As shown in FIG. 1, a source region 140 formed by N-type doping is disposed at the first end of the flash memory cell MC 100, and a drain region 150 formed by N-type doping is further disposed at the second end of the flash memory cell MC 100. The source region 140 is connected to a metal source 142, that is, the first electrode S, located in the upper layer through a contact hole 141, and the drain region 150 is connected to a metal drain 152, that is, the second electrode D, located in the upper layer through a contact hole 151.

According to an embodiment of the present disclosure, the first electrode S and the second electrode D may include a metal or highly doped polysilicon. When the first electrode S and the second electrode D are formed of a metal, they may include at least one of the following materials: aluminum, titanium, titanium nitride, copper, tungsten, cobalt, and manganese.

As described above, as shown in FIG. 1, the gate structure of the first storage transistor MS 110 may sequentially have the channel region 111, the gate dielectric stack 112, the gate electrode 116 and the hard mask blocking portion 117 for sidewall self-alignment from bottom to top. According to an embodiment of the present disclosure, the gate electrode 116 may include, for example, polysilicon, a metal gate, a metal silicide material, or a combination thereof. According to an embodiment of the present disclosure, the hard mask blocking portion 117 may include, for example, silicon oxide, silicon nitride, a silicon glass material, or a combination thereof.

In addition, as shown in FIG. 1, the gate dielectric stack 112 has the first oxide layer (tunneling oxide layer) 113, the storage dielectric layer (charge storage layer) 114 and the second oxide layer (blocking oxide layer) 115 sequentially stacked in the vertical direction. According to an embodiment of the present disclosure, the first oxide layer 113 and the second oxide layer 115 may include, for example, silicon oxide or aluminum oxide, etc.

According to an embodiment of the present disclosure, the storage dielectric layer 114 may include one or more storage dielectric layers. In addition, according to an embodiment of the present disclosure, the storage dielectric forming the storage dielectric layer 114 may include: mono-element or multi-element oxide, such as hafnium oxide, tantalum oxide, titanium oxide, zirconium oxide, hafnium aluminum oxide; mono-element or multi-element nitride, such as silicon nitride; mono-element or multi-element oxynitride, such as silicon oxynitride; a polysilicon or nano-crystal material; or combinations thereof.

According to an embodiment of the present disclosure, when the storage dielectric layer 114 is formed of, for example, a silicon nitride material, the first oxide layer 113, the storage dielectric layer 114 and the second oxide layer 115 may form the gate dielectric stack 112 as an ONO (oxide-nitride-oxide) composite storage dielectric. At this time, the first storage transistor MS 110 may be a SONOS type storage transistor.

Furthermore, according to an embodiment of the present disclosure, the first storage transistor MS 110 may be another trap charge trapping type storage transistor having a similar operating mechanism to the SONOS type storage transistor. This type of storage transistor uses a high K material containing rich charge traps such as silicon oxynitride, hafnium oxide, tantalum oxide, titanium oxide, zirconium oxide, hafnium aluminum oxide, etc. as the storage dielectric layer 114 instead of the silicon nitride material in the SONOS memory.

In addition, according to an embodiment of the present disclosure, the first storage transistor MS 110 may also be a floating gate type storage transistor, which adopts a polysilicon material instead of the silicon nitride material in the SONOS memory to form a floating gate for storing charges, as the storage dielectric layer 114.

In addition, according to an embodiment of the present disclosure, the first storage transistor MS 110 may also be a nano-crystal memory transistor, which adopts a nano-crystal material with quantum dots as the storage dielectric layer 114 instead of the silicon nitride material in the SONOS memory.

According to an embodiment of the present disclosure, the length of the gate electrode 116 of the first storage transistor MS 110 may be defined by the length of the hard mask blocking portion 117 disposed on the gate electrode 116 through a self-alignment process. It should be noted by those skilled in the art that the "length" referred to herein means the size of the stated object in the first direction DR1.

According to an embodiment of the present disclosure, the second storage transistor MD 130 has the same structure as the first storage transistor MS 110 and may be manufactured by the same process as the first storage transistor MS 110 except being disposed at the opposite side of the selection transistor MG 120, and thus a detailed description of the structure of the second storage transistor MD 130 will be omitted here for brevity.

The gate structure of the selection transistor MG 120 may sequentially include a channel region 121, a gate dielectric layer 122 and a gate electrode 123 from bottom to top. According to an embodiment of the present disclosure, the gate electrode 123 of the selection transistor MG 120 is connected to a word line. The length of the gate electrode 123 is defined by the process size of the photolithography process. According to an embodiment of the present disclosure, the gate dielectric layer 122 may include a material such as silicon oxide, silicon oxynitride, hafnium oxide, etc. In addition, according to an embodiment of the present disclosure, the gate electrode 123 may include a material such as polysilicon, a metal gate, a metal silicide material, or a combination thereof.

According to an embodiment of the present disclosure, the channel regions 111, 131, and 121 of the first storage transistor MS 110, the second storage transistor MD 130, and the selection transistor MG 120 may each have a first doping type, and the doping concentration of the channel regions 111 and 131 of the first storage transistor MS 110 and the second storage transistor MD 130 may be lower than the doping concentration of the channel region 121 of the selection transistor MG 120.

In addition, according to an embodiment of the present disclosure, the channel regions 111 and 131 of the first storage transistor MS 110 and the second storage transistor MD 130 may have a second doping type or be undoped intrinsic channel regions, and the channel region 121 of the selection transistor MG 120 may have a first doping type different from the second doping type.

For example, as shown in FIG. 1, where the first doping type is P-type and the second doping type is N-type, the doping concentrations of the P-type channels 111 and 131 of the first storage transistor MS 110 and the second storage transistor MD 130 are lower than the doping concentration of the P-type channel 121 of the selection transistor MG 120. In addition, according to an embodiment of the present disclosure, the channel regions 111 and 131 may also be undoped intrinsic channels or N-type doped channel regions.

According to an embodiment of the present disclosure, the flash memory cell MC 100 further includes: a first isolation portion 124 disposed between the first storage transistor MS 110 and the selection transistor MG 120 in the horizontal direction DR1, for isolating the gate electrode 116 of the first storage transistor MS 110 and the gate electrode 123 of the selection transistor MG 120; and a second isolation portion 125 disposed between the selection transistor MG 120 and the second storage transistor MD 130 in the horizontal direction DR1, for isolating the gate electrode 123 of the selection transistor MG 120 and the gate electrode 136 of the second storage transistor MD 130.

Specifically, as shown in FIG. 1, both sides of the gate electrode 123 of the selection transistor MG 120 are provided with the first isolation portion 124 and the second isolation portion 125 in the form of sidewalls. They are respectively used to electrically isolate the gate electrode 116 of the first storage transistor MS 110 and the gate electrode 136 of the second storage transistor MD 130 with a specific isolation gap length. According to an embodiment of the present disclosure, the first isolation portion 124 and the second isolation portion 125 may include the same material as the gate dielectric layer 122.

The flash memory cell according to an embodiment of the present disclosure can implement two storage transistors in one flash memory cell, thus the equivalent area of each storage bit may be greatly reduced, whereby a lower cost and a higher integration density are obtained.

In addition, the storage transistors in the flash memory cell according to an embodiment of the present disclosure can adopt the SONOS type device structure with a simple structure, with the advantages of a simple process, a low gate electrode operation voltage, and a good data retention reliability.

In addition, mutual influence of two storage bits is isolated by the selection transistor in the flash memory cell according to an embodiment of the present disclosure. In addition, the distribution width and transverse diffusion of the stored charges are suppressed, so that a higher stored charge density can be obtained in the silicon nitride storage layer, the problems of wide charge distribution, large mutual interference, failure of reducing gate length and the like existing in the conventional NROM storage cell with two storage bits are avoided, and the storage window and the data reliability are obviously improved.

In particular, the equivalent channel length of the flash memory cell according to an embodiment of the present disclosure is the sum of the lengths of the gate electrodes of the first storage transistor, the selection transistor and the second storage transistor. As described above, the length of the gate electrode of the selection transistor is defined by the process feature size of the photolithography process, usually approximately equal to or slightly larger than the critical feature size of the photolithography process, which is commonly denoted by F (or CF). Furthermore, the lengths of the gate electrodes of the first storage transistor and the second storage transistor are respectively defined by the lengths of the self-aligned sidewall hard mask blocking portions, and therefore, the size thereof may be smaller than F. Therefore, according to an embodiment of the present invention, a smaller channel length of the flash memory cell may be obtained under the same process feature size, thereby achieving the purpose of reducing the area and the manufacturing cost of the flash memory cell.

In addition, in a flash memory cell array composed of the flash memory cells according to an embodiment of the present disclosure, for the flash memory cells that are not selected for operation, the gate electrodes of the selection transistor and the first and second storage transistors are connected to the ground, whereby the entire series channel of the flash memory cell is completely turned off, and the equivalent channel length is enlarged, and therefore, the source-drain punch-through of the flash memory cell at a high operating voltage may be avoided under a smaller process feature size. Therefore, the problem that the length of the gate electrode of the existing flash memory cell cannot be reduced along with the scaling down of the process characteristic size is overcome. Therefore, the flash memory cell according to an embodiment of the present disclosure has better process scaling down capability, whereby a smaller cell area and manufacturing cost can be obtained by reducing the process feature size.

Further, in the flash memory cell according to an embodiment of the present disclosure, the threshold voltage of the storage transistors and the gate electrode operation voltage at the time of erasing, writing and reading operations may decrease by decreasing the doping concentration of the P-type channel regions of the first storage transistor and the second storage transistor or designing them into N-type doped channel regions, whereby the reliability of the storage transistors may be improved. Meanwhile, the punch-through resistance voltage of the flash memory cell may be improved and the leakage current between the source and drain of the non-selected flash memory cell may be reduced by increasing the doping concentration of the P-type channel region of the selection transistor.

Figure 2:
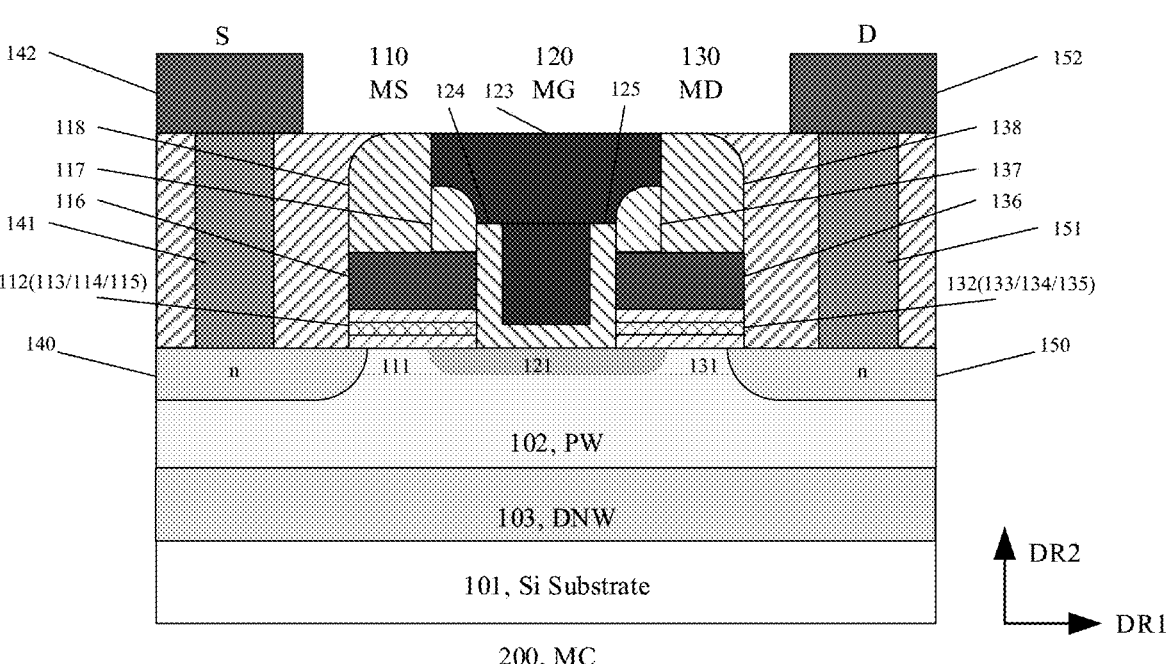
FIG. 2 illustrates a cross-sectional view of a flash memory cell according to a second embodiment of the present disclosure.

FIG. 2 illustrates a cross-sectional view of a flash memory cell MC 200 according to a second embodiment of the present disclosure. In addition to the configuration of the hard mask blocking portion and the gate electrode of the selection transistor, the structure of the flash memory cell MC 200 according to the second embodiment of the present disclosure is substantially the same as that of the flash memory cell MC 100 according to the first embodiment of the present disclosure, and thus the same components in the flash memory cell MC 200 as those of the flash memory cell MC 100 are denoted by the same reference numerals, and the detailed description thereof will be omitted.

As shown in FIG. 2, according to an embodiment of the present disclosure, the gate electrode 123 of the selection transistor MG 120 may have eave portions extending above the gate electrode 116 of the first storage transistor MS 110 and the gate electrode 136 of the second storage transistor MD 130 in the horizontal direction DR1. The eave portions may be isolated from the gate electrode 116 of one storage transistor MS 110 and the gate electrode 136 of the second storage transistor MD 130 by a first hard mask blocking portion 117 of the first storage transistor MS 110 and a first hard mask blocking portion 137 of the second storage transistor MD 130 for sidewall self-alignment, respectively.

In addition, the flash memory cell MC 200 according to the second embodiment of the present disclosure further includes a second hard mask blocking portion 118 for sidewall self-alignment that is disposed on the gate electrode 116 of the first storage transistor MS 110 and adjacent to the first hard mask blocking portion 117, and a second hard mask blocking portion 138 for sidewall self-alignment that is disposed on the gate electrode 136 of the second storage transistor MD 130 and adjacent to the first hard mask blocking portion 137. In this case, the length of the gate electrode 116 of the first storage transistor MS 110 may be defined by the sum of the lengths of the first hard mask blocking portion 117 and the second hard mask blocking portion 118 disposed on the gate electrode 116 through a self-alignment process. Correspondingly, the length of the gate electrode 136 of the second storage transistor MD 130 may be defined by the sum of the lengths of the first hard mask blocking portion 137 and the second hard mask blocking portion 138 disposed on the gate electrode 136 by a self-alignment process.

In other words, the hard mask blocking portions on the gate electrodes of the first storage transistor and the second storage transistor of the flash memory cell according to the second embodiment of the present disclosure are constituted by the first hard mask blocking portions and the second hard mask blocking portions, so that compared with the flash memory cell according to the first embodiment of the present disclosure, the locations of the gate electrodes of the first storage transistor and the second storage transistor in the flash memory cell according to the second embodiment of the present disclosure may be moved toward the selection transistor in the middle of them to further reduce the size of the flash memory cell. According to an embodiment of the invention, a smaller channel length of the flash memory cell may be obtained under the same process feature size, thereby achieving the purpose of reducing the area and the manufacturing cost of the flash memory cell.

Figure 3:
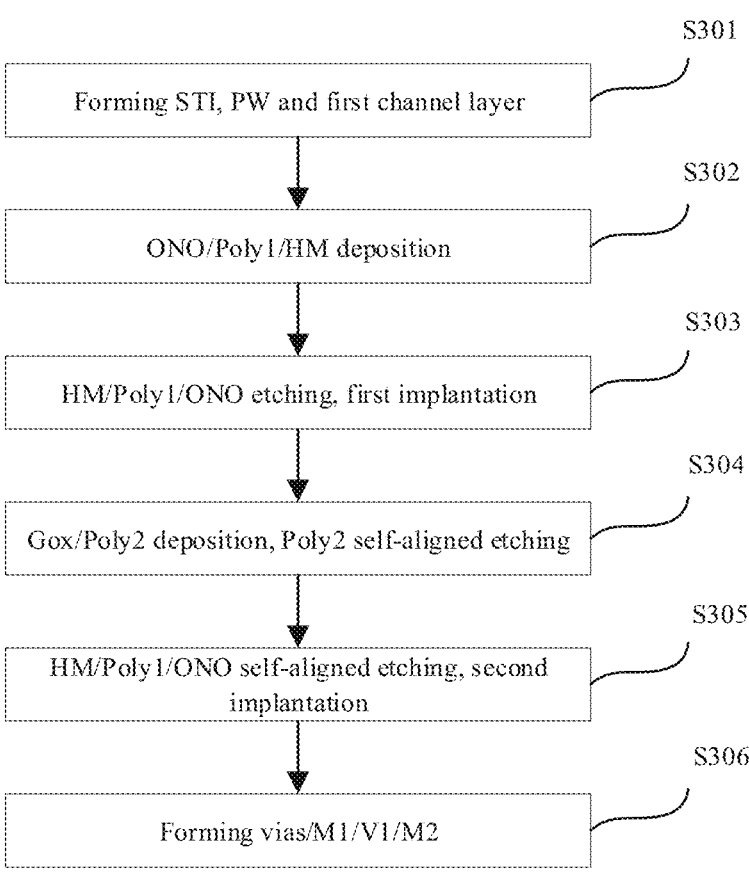
FIG. 3 illustrates a flow chart of a manufacturing method of the flash memory cell according to the first embodiment of the present disclosure.
Figure 4:
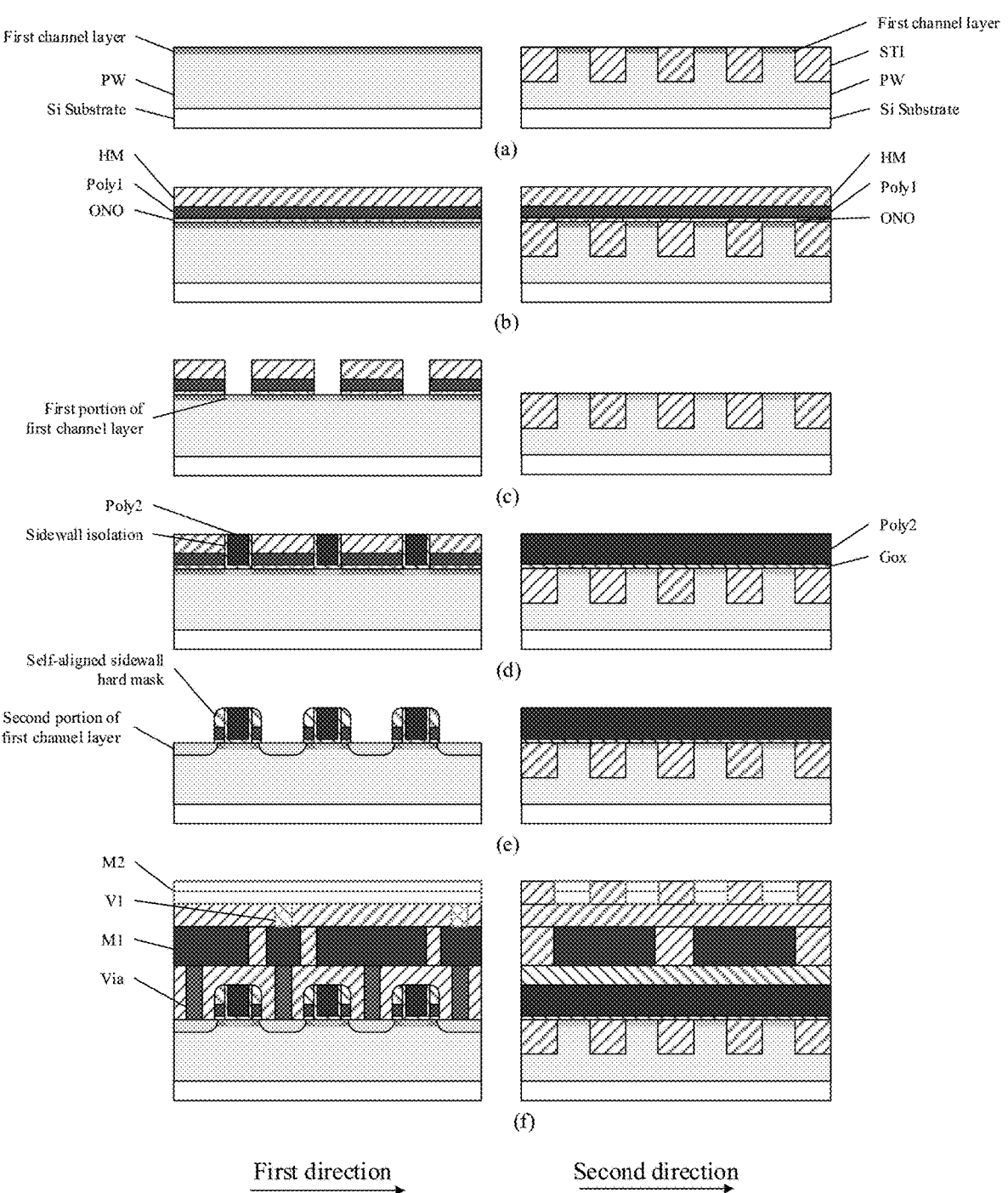
FIG. 4 illustrates a cross-sectional view of the flash memory cell at respective steps of the method shown in FIG. 3.

Next, a method 300 for manufacturing the flash memory cell MC 100 according to the first embodiment of the present disclosure will be described with reference to FIGS. 3 and 4. FIG. 3 illustrates a flow chart of the method 300 for manufacturing the flash memory cell MC 100 according to the first embodiment of the present disclosure. FIG. 4 illustrates a cross-sectional view of the flash memory cell MC 100 in the steps of the method 300 shown in FIG. 3.

In step S301 shown in FIG. 3, as shown in (a) in FIG. 4, in a semiconductor substrate such as a silicon (Si) substrate, a plurality of columns of shallow trench isolation (STI) structures are formed repeatedly in a first direction along a surface of the substrate by, for example, etching, and a deep well region (not shown) of the second doping type is formed in a portion where the STI structures are not formed by, for example, an ion implantation process, and subsequently a well region PW of the first doping type is formed in an upper portion of the deep well region.

It should be noted that the second direction shown in FIG. 4 is a direction perpendicular to the first direction along the surface of the substrate.

According to an embodiment of the present disclosure, the first doping type may be defined as P type, and the second doping type may be defined as N type, but those skilled in the art should appreciate that the present disclosure is not limited thereto, and the first doping type may also be N type, at this time the second doping type may be P type.

In addition, in step S301, as shown in (a) in FIG. 4, a first channel layer may also be formed at the upper surface of the well region PW by, for example, an ion implantation process. As will be described later, the channel region of the selection transistor is formed by a first implantation in a first portion of the first channel layer, the source region of the first storage transistor and the drain region of the second storage transistor are formed by a second implantation in a second portion of the first channel layer, and the remaining portion of the first channel layer other than the first portion and the second portion is used to form channel regions of the first storage transistor and the second storage transistor.

Subsequently, in step S302 shown in FIG. 3, as shown in (b) in FIG. 4, the gate dielectric stack ONO having the first oxide layer, the storage dielectric layer and the second oxide layer sequentially stacked in the vertical direction may be formed on the first channel layer by, for example, a deposition process. In step S302 shown in FIG. 3, as shown in (b) in FIG. 4, a first gate electrode layer Poly1 such as polysilicon and a hard mask layer HM may also be formed sequentially on the gate dielectric stack ONO by, for example, a deposition process, the first gate electrode layer Poly1 being used to form the gate electrodes of the first storage transistor and the second storage transistor.

Subsequently, in step S303 shown in FIG. 3, as shown in (c) in FIG. 4, the hard mask layer HM, the first gate electrode layer Poly1 and the gate dielectric stack ONO may be sequentially etched by an etching process to expose the first portion of the first channel layer, and the first portion of the first channel layer may be doped by the first implantation (for example, an ion implantation process) to form the channel region of the selection transistor.

Subsequently, in step S304 shown in FIG. 3, as shown in (d) in FIG. 4, sidewall isolations (that is, the first isolation portion and the second isolation portion) of the selection transistor, the gate dielectric layer Gox of the selection transistor and a second gate electrode layer Poly2 of such as polysilicon for forming the gate electrode of the selection transistor are formed on the channel region of the selection transistor by, for example, a deposition process, a self-aligned etching process and a chemical mechanical grinding and polishing process.

Subsequently, in step S305 shown in FIG. 3, as shown in FIG. 4 (*e*), the hard mask layer HM may be etched on opposite sides of the selection transistor to form the hard mask blocking portions. For example, the original hard mask layer is removed by etching on the opposite side of the selection transistor, then a hard mask layer is re-prepared and anisotropically etched to form the hard mask blocking portions. Subsequently, the first gate electrode layer Poly1 and the gate dielectric stack ONO are self-aligned etched sequentially using the hard mask blocking portions as a self-aligned sidewall hard mask to expose the second portion of the first channel layer, and the second portion of the first channel layer is doped by the second implantation (for example, an ion implantation process) to form the source region of the first storage transistor and the drain region of the second storage transistor (that is, the source and drain of the flash memory cell).

Subsequently, in step S306 shown in FIG. 3, as shown in (f) in FIG. 4, the first electrode of the flash memory cell connected to the source region of the first storage transistor and the second electrode of the flash memory cell connected to the drain region of the second storage transistor may be formed by forming contact holes. In step S306, as shown in (f) in FIG. 4, external connections of the flash memory cell may also be achieved by forming, for example, vias V1 and metal lines M1, M2.

Those skilled in the art should appreciate that although it is shown in FIGS. 3 and 4 that two layers of metal M1 and M2 are prepared to achieve the external connections of the flash memory cell, the present disclosure is not limited thereto. Based on the teaching of the present disclosure, those skilled in the art may use more or fewer layers of metal to achieve the external connections of the flash memory cell.

Figure 5:
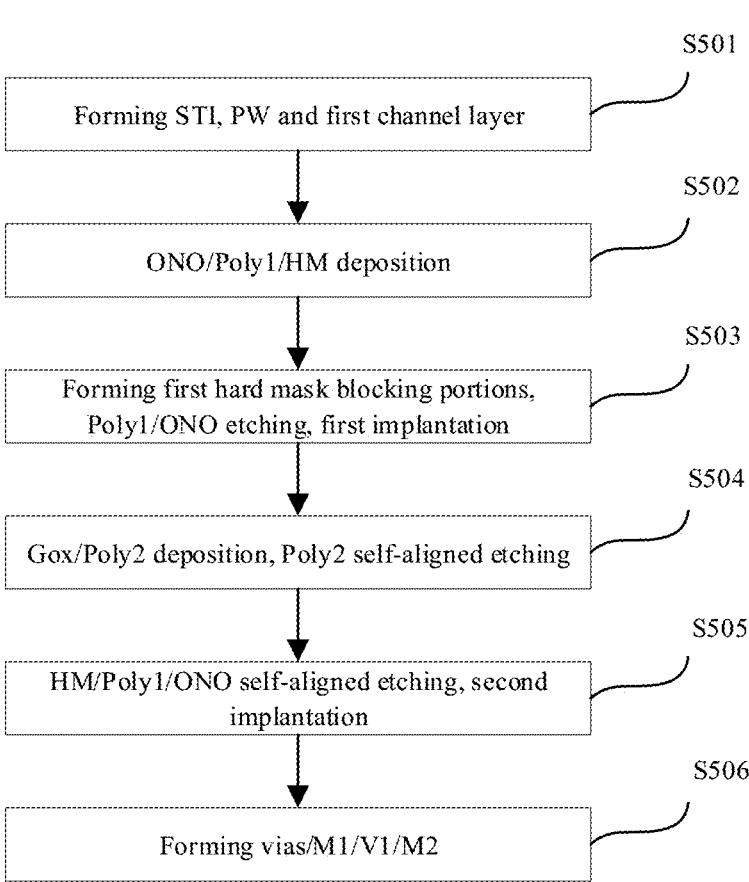
FIG. 5 illustrates a flow chart of a manufacturing method of the flash memory cell according to the second embodiment of the present disclosure.
Figure 6:
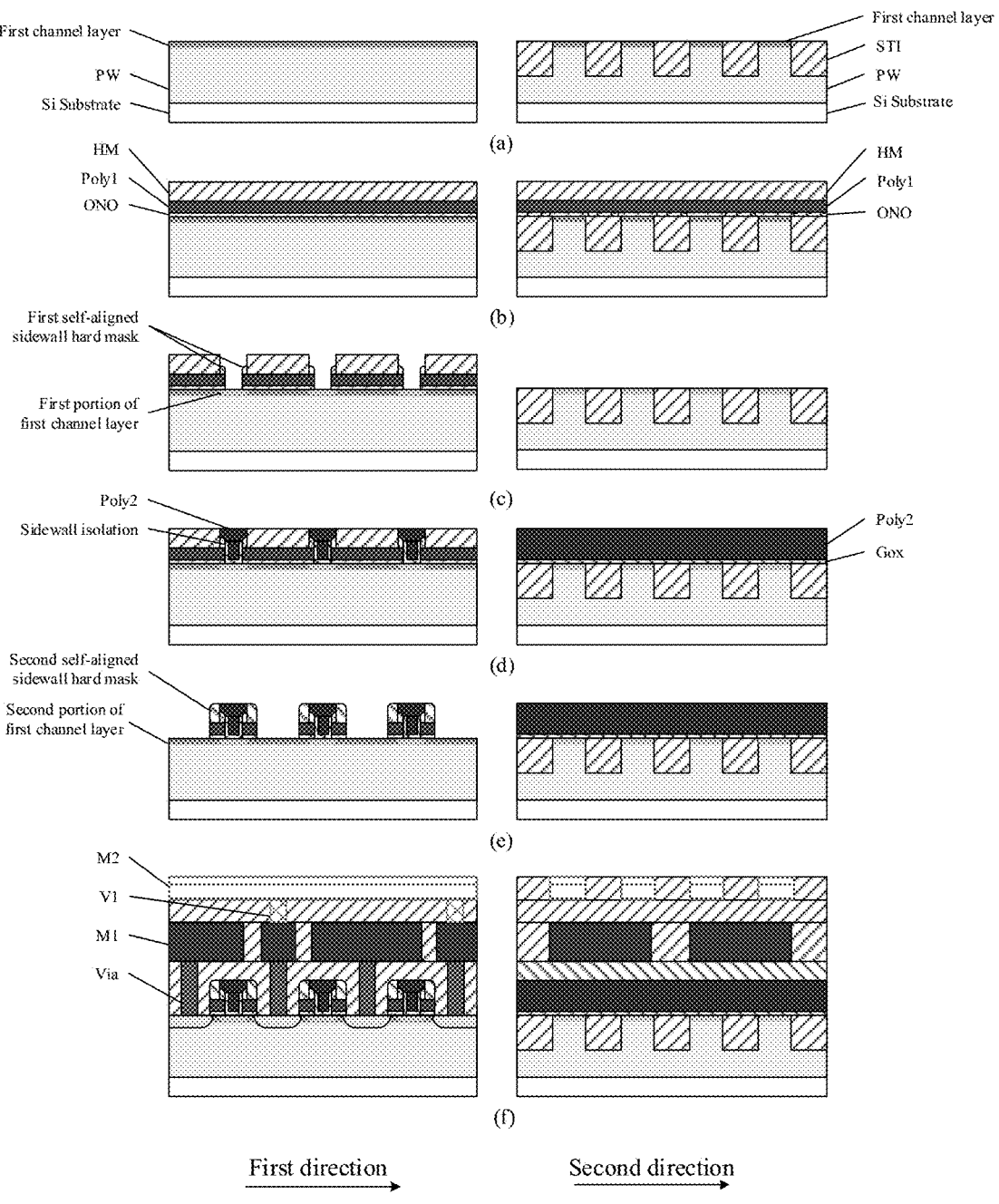
FIG. 6 illustrates a cross-sectional view of the flash memory cell at respective steps of the method shown in FIG. 5.

Next, a method 500 for manufacturing the flash memory cell MC 200 according to the second embodiment of the present disclosure will be described with reference to FIGS. 5 and 6. FIG. 5 illustrates a flowchart of the method 500 for manufacturing the flash memory cell MC 200 according to the second embodiment of the present disclosure. FIG. 6 illustrates a cross-sectional view of the flash memory cell MC 200 in the steps of the method 500 shown in FIG. 5.

In step S501 shown in FIG. 5, as shown in (a) in FIG. 6, in a semiconductor substrate such as a silicon (Si) substrate, a plurality of columns of shallow trench isolation (STI) structures are formed repeatedly in a first direction along a surface of the substrate by, for example, etching, and a deep well region (not shown) of the second doping type is formed in a portion where the STI structures are not formed by, for example, an ion implantation process, and subsequently a well region PW of the first doping type is formed in an upper portion of the deep well region.

It should be noted that the second direction shown in FIG. 6 is a direction perpendicular to the first direction along the surface of the substrate.

According to an embodiment of the present disclosure, the first doping type may be defined as P type, and the second doping type may be defined as N type, but those skilled in the art should appreciate that the present disclosure is not limited thereto, and the first doping type may also be N type, at this time the second doping type may be P type.

In addition, in step S501, as shown in (a) in FIG. 6, a first channel layer may also be formed at the upper surface of the well region PW by, for example, an ion implantation process. As will be described later, the channel region of the selection transistor is formed by a first implantation in a first portion of the first channel layer, the source region of the first storage transistor and the drain region of the second storage transistor are formed by a second implantation in a second portion of the first channel layer, and the remaining portion of the first channel layer other than the first portion and the second portion is used to form channel regions of the first storage transistor and the second storage transistor.

Subsequently, in step S502 shown in FIG. 5, as shown in (b) in FIG. 6, the gate dielectric stack ONO having the first oxide layer, the storage dielectric layer, and the second oxide layer sequentially stacked in the vertical direction may be formed on the first channel layer by, for example, a deposition process. In step S502 shown in FIG. 5, as shown in (b) in FIG. 6, a first gate electrode layer Poly1 such as polysilicon and a hard mask layer HM may also be formed sequentially on the gate dielectric stack ONO by, for example, a deposition process, the first gate electrode layer Poly1 being used to form the gate electrodes of the first storage transistor and the second storage transistor.

Subsequently, in step S503 shown in FIG. 5, as shown in (c) in FIG. 6, the hard mask layer HM, the first gate electrode layer Poly1 and the gate dielectric stack ONO may be sequentially etched by a photolithographic process to expose the first portion of the first channel layer, and the first portion of the first channel layer may be doped by the first implantation (for example, an ion implantation process) to form the channel region of the selection transistor.

Here, it should be noted that, unlike (c) in FIG. 4, as shown in (c) in FIG. 6, in step S503 shown in FIG. 5, the first hard mask blocking portions (that is, the first self-aligned sidewall hard mask shown in (c) in FIG. 6) for isolating the selection transistor from the first storage transistor and the second storage transistor may also be formed on the first gate electrode layer Poly1 by etching the hard mask layer HM. For example, the hard mask layer HM may be patterned and etched, subsequently an additional hard mask layer is deposited and the hard mask layer is anisotropically etched, to form the first hard mask blocking portions on the first gate electrode layer Poly1 for isolating the selection transistor from the first storage transistor and the second storage transistor. Subsequently, the first gate electrode layer Poly1 and the gate dielectric stack ONO are self-aligned etched sequentially by using the first hard mask blocking portions as the first self-aligned sidewall hard mask to expose the first portion of the first channel layer, then the first portion of the first channel layer is doped by the first implantation (for example, an ion implantation process) to form the channel region of the selection transistor.

Subsequently, in step S504 shown in FIG. 5, as shown in (d) in FIG. 6, sidewall isolations (that is, the first isolation portion and the second isolation portion) of the selection transistor, the gate dielectric layer Gox of the selection transistor and a second gate electrode layer Poly2 of such as polysilicon for forming the gate electrode of the selection transistor are formed on the channel region of the selection transistor by, for example, a deposition process, a self-aligned etching process and a chemical mechanical grinding and polishing process.

Here, it should be noted that, unlike (d) in FIG. 4, as shown in (d) in FIG. 6, in step S504 shown in FIG. 5, the gate electrode of the selection transistor having eave portions may also be formed using the first hard mask blocking portions.

Subsequently, in step S505 shown in FIG. 5, as shown in (e) in FIG. 6, the hard mask layer HM may be self-aligned etched at opposite sides of the selection transistor to form the second hard mask blocking portions. Step S505 may be the same as step S305 shown in FIGS. 3 and 4, and thus the details thereof will not be described further. Subsequently, the first gate electrode layer Poly1 and the gate dielectric stack ONO are self-aligned etched sequentially by using the second hard mask blocking portions as a second self-aligned sidewall hard mask to expose the second portion of the first channel layer, and the second portion of the first channel layer is doped by the second implantation (for example, an ion implantation process) to form the source region of the first storage transistor and the drain region of the second storage transistor (that is, the source and drain of the flash memory cell).

Subsequently, in step S506 shown in FIG. 5, as shown in (f) in FIG. 6, the first electrode of the flash memory cell connected to the source region of the first storage transistor and the second electrode of the flash memory cell connected to the drain region of the second storage transistor may be formed by forming contact holes. In step S506, as shown in (f) in FIG. 6, external connections of the flash memory cell may also be achieved by forming, for example, vias V1 and metal lines M1, M2

Those skilled in the art should appreciate that although it is shown in FIGS. 5 and 6 that two layers of metal M1 and M2 are prepared to achieve the external connections of the flash memory cell, the present disclosure is not limited thereto. Based on the teaching of the present disclosure, those skilled in the art may use more or fewer layers of metal to achieve the external connections of the flash memory cell.

The flash memory cell according to the present disclosure has the technical advantages of low power consumption, small size and large capacity. The flash memory cell according to the present disclosure can achieve better process size scaling down and higher array integration density, and has lower cost compared with the prior art.

Figure 7:
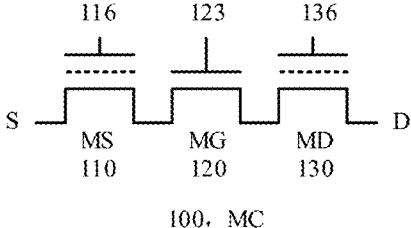
FIG. 7 illustrates an equivalent circuit diagram of the flash memory cell according to an embodiment of the present disclosure.
Figure 8:
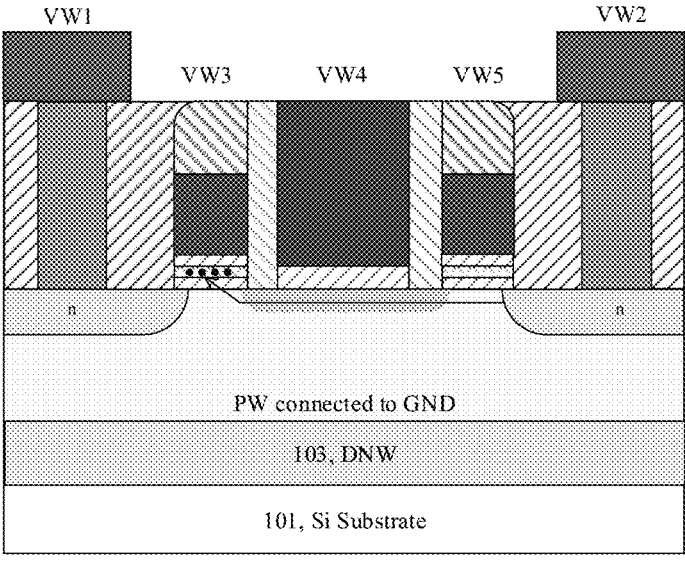
FIG. 8 illustrates a schematic diagram of performing a writing operation on a first storage transistor according to an embodiment of the present disclosure.
Figure 9:
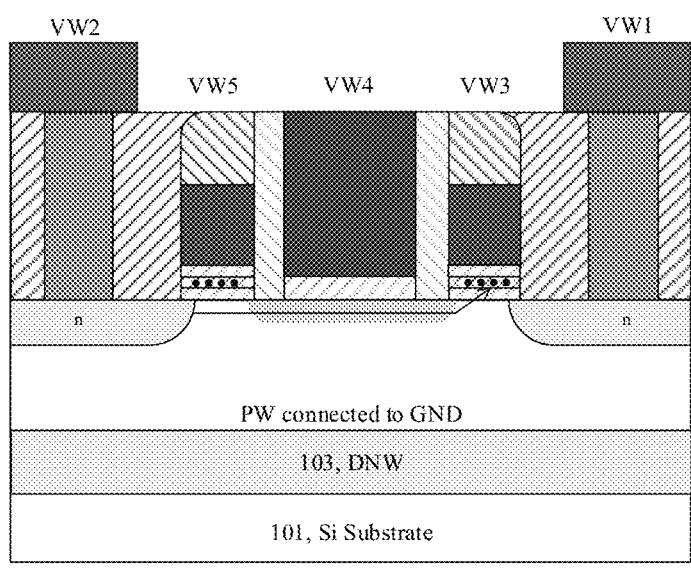
FIG. 9 illustrates a schematic diagram of performing a writing operation on a second storage transistor according to an embodiment of the present disclosure.

FIG. 7 illustrates an equivalent circuit of the flash memory cell MC 100 according to an embodiment of the present disclosure. FIG. 8 illustrates a schematic diagram of performing a writing operation on the first storage transistor MS 110 according to an embodiment of the present disclosure. FIG. 9 illustrates a schematic diagram of performing a writing operation on the second storage transistor MD 130 according to an embodiment of the present disclosure.

Specifically, as shown in FIG. 7, the flash memory cell MC 100 includes the first storage transistor MS 110, the selection transistor MG 120, and the second storage transistor MD 130 sequentially connected in series. The selection transistor MG 120 may isolate the first storage transistor MS 110 and the second storage transistor MD 130 and perform a selection operation on the first storage transistor MS 110 and the second storage transistor MD 130. As shown in FIG. 7, by controlling voltages applied to the source region (that is, the first electrode S) of the first storage transistor MS 110, the gate electrode 116 of the first storage transistor MS 110, the gate electrode 123 of the selection transistor MG 120, the gate electrode 136 of the second storage transistor MD 130, and the drain region (that is, the second electrode D) of the second storage transistor MD 130, a writing operation on the first storage transistor MS 110 or the second storage transistor MD 130 may be implemented.

According to an embodiment of the present disclosure, when a writing operation is performed on the flash memory cell MC 100, the P well 102 of the flash memory cell MC 100 may be connected to the ground.

Specifically, according to an embodiment of the present disclosure, as shown in FIG. 8, when performing the writing operation on the first storage transistor MS 110 of the flash memory cell MC 100, a first writing voltage VW1 is applied to the first electrode S, a second writing voltage VW2 is applied to the second electrode D, a third writing voltage VW3 is applied to the gate electrode 116 of the first storage transistor MS 110, a fourth writing voltage VW4 is applied to the gate electrode 123 of the selection transistor MG 120, and a fifth writing voltage VW5 is applied to the gate electrode 136 of the second storage transistor MD 130.

According to an embodiment of the present disclosure, the first writing voltage VW1 is higher than a preset voltage, which is predetermined based on the carrier barrier height at the interface between the substrate and the gate dielectric stack 112 of the first storage transistor MS 110. For example, in the flash memory cell MC 100 shown in FIG. 8, the preset voltage may enable electrons to cross the electron barrier at the interface between the P-type channel region 111 and the lower first oxide layer (tunneling oxide) 113 in the gate dielectric stack 112. For example, in the case where the P-type channel region 111 includes silicon and the first oxide layer 113 includes silicon dioxide, the barrier height is 3.2 electron volts (eV). In this case, the first writing voltage VW1 is typically higher than 3 volts (V). For example, the first writing voltage VW1 may be in a range of 3 V to 6 V. According to an embodiment of the present disclosure, the first writing voltage VW1 may be provided by an external constant voltage source.

According to an embodiment of the present disclosure, the second writing voltage VW2 is equal to or higher than a second power voltage VSS, which may be a ground voltage GND. Further, according to an embodiment of the present disclosure, the second writing voltage VW2 is connected to the second power voltage VSS through a constant current load.

According to an embodiment of the present disclosure, the third writing voltage VW3 is higher than the first writing voltage VW1. For example, the third writing voltage VW3 may be in a range of 4V to 12V.

According to an embodiment of the present disclosure, the fourth writing voltage VW4 is equal to or lower than a first power voltage VDD, which is higher than the second power voltage VSS and may be in a range of 0.8 V to 5 V.

According to an embodiment of the present disclosure, the first writing voltage VW1, the fourth writing voltage VW4, and the fifth writing voltage VW5 are higher than the second writing voltage VW2. For example, the fifth writing voltage VW5 may be in a range of 3 V to 8 V.

Also, according to an embodiment of the present disclosure, during the writing operation of the flash memory cell MC 100, the first to fifth writing voltages VW1 to VW5 turn on all the first storage transistor MS 110, the second storage transistor MD 130, and the selection transistor MG 120.

Similarly, according to an embodiment of the present disclosure, as shown in FIG. 9, when performing the writing operation on the second storage transistor MD 130 of the flash memory cell MC 100, the second writing voltage VW2 is applied to the first electrode S, the first writing voltage VW1 is applied to the second electrode D, the fifth writing voltage VW5 is applied to the gate electrode 116 of the first storage transistor MS 110, the fourth writing voltage VW4 is applied to the gate electrode 123 of the selection transistor MG 120, and the third writing voltage VW3 is applied to the gate electrode 136 of the second storage transistor MD 130.

As can be seen, because of the symmetrical structure of the flash memory cell MC 100, there is also a symmetrical relationship between the respective writing voltages VW1 to VW5 applied during the writing operation of the first storage transistor MS 110 and the second storage transistor MD 130. Therefore, repetitive description of the writing voltages applied during the writing operation of the second storage transistor MD 130 is not made here for brevity.

According to an embodiment of the present disclosure, the writing operation on the first storage transistor MS 110 and the second storage transistor MD 130 described above employs a channel hot electron injection mechanism of a low gate voltage.

Specifically, taking the first storage transistor MS 110 as an example, when performing the writing operation on the first storage transistor MS 110, the gate electrode 123 of the selection transistor MG 120 is applied with the fourth writing voltage VW4 slightly higher than the threshold voltage thereof so that it is in a weak on-state, thereby suppressing the on-current (generally in the order of microamperes) of the flash memory cell MC 100, which may greatly reduce the voltage difference between the series channels (121 and 131) of the selection transistor MG 120 and the second storage transistor MD 130. Therefore, the voltage difference VW1-VW2 between the first electrode S and the second electrode D of the flash memory cell MC 110 is mostly applied on the on-channel region 111 of the first storage transistor MS 110, thereby a channel hot electron physical effect occurs, and under the attraction of the third writing voltage VW3 applied to the gate electrode 116 of the first storage transistor MS 110, electrons are injected into the storage dielectric layer 114, so that the threshold voltage of the first storage transistor MS 110 increases.

In particular, since the gate electrode length of the first storage transistor MS 110 is much shorter than the equivalent channel length of the flash memory cell MC 100, the lateral electric field and the channel hot electron injection efficiency of the on-channel of the first storage transistor MS 110 may be substantially increased.

Therefore, compared with the existing channel hot electron injection writing method, the writing method according to an embodiment of the present disclosure has the advantages of low operation power consumption and fast writing speed, and may improve the data write-throughput of memory by increasing the number of cells written in parallel.

In contrast, when the NOR type flash memory cell of the prior art adopts the channel hot electron injection mechanism for the writing operation, the source electrode (equivalent to the first electrode S of the present application) is connected to the ground, the drain electrode (equivalent to the second electrode D of the present application) is applied with a drain electrode voltage VD of about 4 V, and the control gate electrode is applied with a high voltage of 6 V to 10 V. At this time, the flash memory cell is in a saturated on-state and has a source-drain on-current ($I_{DS}$) in the order of hundred microamperes, resulting in a large writing power consumption. Meanwhile, since the channel hot electron injection mechanism injects a floating gate current ($I_{FG}$) into the floating gate, the threshold voltage of the storage transistor increases. According to the lucky electron model of the channel hot electron effect, the floating gate injection current $I_{FG}=I_{DS}\times P_{INJ}$, wherein $P_{INJ}$ is the injection probability that is affected by the electric field at the drain. As the writing proceeds, the electron charges injected into the floating gate increase and the threshold voltage increases, so that the equivalent potential ($V_{FG}$) of the floating gate decreases. The decrease of the floating gate potential results in decrease of the source-drain on-current ($I_{DS}$), so that the effect of the hot electron injection mechanism is reduced. However, the decrease of floating gate potential also results in decrease of the drain saturated pinch-off voltage ($V_{D,SAT}$), which in turn results in increase of the electric field of the pinch-off region $E_{SAT}=(V_D-V_{D,SAT})/L_{SAT}$ (wherein $L_{SAT}$ is the length of the saturated pinch-off region), so that the effect of the hot electron injection mechanism is improved.

Figure 10:
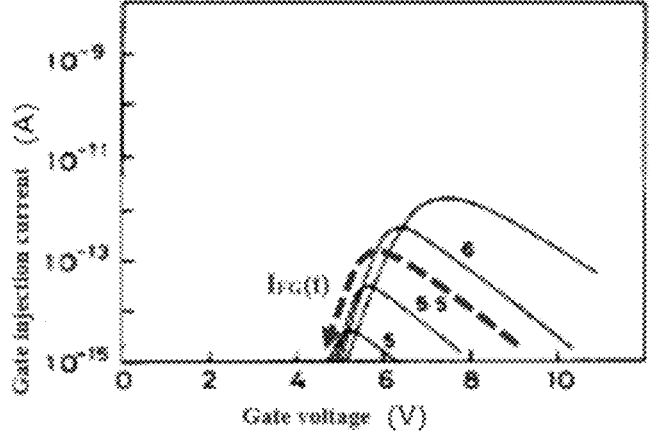
FIG. 10 illustrates a graph of the relationship between a floating gate injection current and a floating gate voltage during a channel hot electron writing operation according to the prior art.

FIG. 10 illustrates a graph of the relationship between the floating gate injection current $I_{FG}$ and the floating gate voltage $V_G$ during the channel hot electron writing operation according to the prior art. As shown in FIG. 10. the floating gate injection current $I_{FG}$ of the flash memory cell of the prior art is affected by the above two factors, and shows a trend of increasing first and then decreasing. The non-monotonic variation trend of the channel hot electron injection results that the threshold variation of the memory cell to be discretely varied with the writing time, and therefore, the writing threshold voltage may not be accurately controlled by adjusting the voltages of the drain and the control gate electrodes or the writing time, resulting in a wide distribution of the writing threshold voltage of the flash memory cell array.

In view of the problems existing in the prior art, according to an embodiment of the present disclosure, during the writing operation of the flash memory cell MC 100, the current $I_{DS}$ flowing between the first electrode S and the second electrode D of the flash memory cell MC 100 may be controlled by controlling the constant current load $I_{WR}$.

Figure 11:
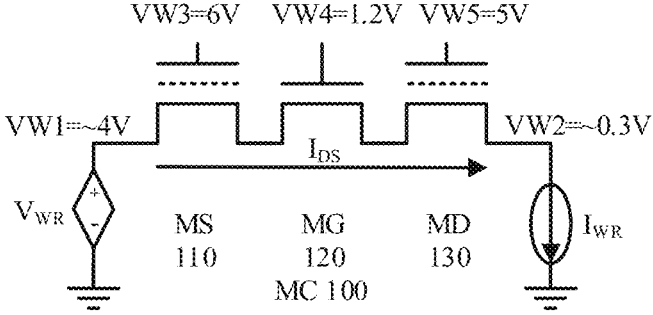
FIG. 11 illustrates an equivalent circuit diagram for performing a writing operation on the first storage transistor according to an embodiment of the present disclosure.

FIG. 11 illustrates an equivalent circuit diagram for performing the writing operation on the first storage transistor MS 110 according to an embodiment of the present disclosure.

As shown in FIG. 11, the writing method of the flash memory cell according to the present disclosure may accurately control the on-current $I_{DS}$ (that is, the current flowing between the first electrode S and the second electrode D of the flash memory cell MC 100) of the flash memory cell during writing by adjusting the constant current $I_{WR}$ of the externally connected constant current load, so as to achieve the purpose of adjusting the programming threshold voltage, thereby improving the writing (programming) threshold voltage distribution accuracy of the flash memory cell array.

According to an embodiment of the present disclosure, the constant current load may be implemented by a current mirror circuit.

Specifically, taking the writing operation on the first storage transistor MS 110 as an example, as shown in FIG. 11, a constant voltage $V_{WR}$ (that is, the first writing voltage VW1) of, for example, about 4 V is applied to the first electrode S, and the constant current load having a pull-down function (having the constant current $I_{WR}$) is connected to the second electrode D to pull the voltage at the second electrode D (that is, the second writing voltage VW2) down to between 0 V to 1 V, for example, about 0.3 V. In addition, the third writing voltage VW3 of, for example, 6 V is applied to the gate electrode 116 of the first storage transistor MS 110, a fourth writing voltage VW4 of, for example, 1.2 V is applied to the gate electrode 123 of the selection transistor MG 120, and a fifth writing voltage VW5 of, for example, 5 V is applied to the gate electrode 136 of the second storage transistor MD 130, so that the first storage transistor MS 110, the second storage transistor MD 130, and the selection transistor MG 120 of the flash memory cell MC 100 are all turned on.

In addition, since the gate voltage VW4 of the selection transistor MG 120 is a low voltage, so that the selection transistor MG 120 is in a low gate voltage saturated on-state, and therefore, the on-current $I_{DS}$ of the entire flash memory cell MC 100 is determined by the on-current of the selection transistor MG 120. When the on-current $I_{DS}$ of the flash memory cell MC 100 is greater than the constant current $I_{WR}$ of the constant current load, the second electrode D of the flash memory cell MC 100 may be charged to increase its voltage VW2, thereby the gate on-voltage ($V_{GS}$=VW4–VW2) of the selection transistor MG 120 decreases, so that the on-current $I_{DS}$ decreases and adaptively becomes the constant current $I_{WR}$ of the constant current load. In contrast, when the on-current $I_{DS}$ of the flash memory cell MC 100 is less than the constant current $I_{WR}$ of the constant current load, the second electrode D of the flash memory cell MC 100 is discharged to decrease its voltage VW2, thereby the gate on-voltage ($V_{GS}$=VW4–VW2) of the selection transistor MG 120 increases, so that the on-current $I_{DS}$ increases and adaptively becomes the constant current $I_{WR}$ of the constant current load.

Through this adaptive effect, during programming of the flash memory cell MC 100, the on-current $I_{DS}$ is constantly equal to the constant current $I_{WR}$ of the constant current load without being affected by factors such as the threshold voltage of the flash memory cell MC 100, process deviation, etc. Further, according to the lucky electron model of the channel hot electron injection mechanism, since the on-current $I_{DS}$ during the writing operation of the flash memory cell MC 100 according to the present disclosure is constant and precisely controllable, the gate program (write) current is the on-current $I_{DS}$ (constantly equal to constant current $I_{WR}$) multiplied by the injection probability coefficient $P_{INJ}$, which may be regarded as a constant, so that the accuracy of programming threshold voltage may be substantially improved.

In addition, since the writing method of the flash memory cell MC 100 according to an embodiment of the present disclosure may accurately control the on-current $I_{DS}$ and further accurately control the threshold voltage of programming (writing), and therefore, a multi-value programming (writing) operation of the first storage transistor MS 110 or the second storage transistor MD 130 may be achieved.

According to an embodiment of the present disclosure, during the writing operation of the flash memory cell MC 100, different data values may be written to the first storage transistor MS 110 or the second storage transistor MD 130 by adjusting the current $I_{WR}$ of the constant current load.

In addition, during the writing operation of the flash memory cell MC 100, different data values may be written to the first storage transistor MS 110 or the second storage transistor MD 130 by adjusting the magnitude or the application time of the first writing voltage VW1.

In this respect, the logic value of the written data according to the multi-value programing operation of the present disclosure is determined by the bit number of the data. For example, if the bit number of the written data is 1, the written data may have two logic values, that is, 0 or 1, and the corresponding storage transistor has 1 programing threshold voltage state. In addition, for example, if the bit number of the written data is 2, the written data may have four logic values, that is, 0, 1, 2, 3, and the corresponding storage transistor should have 3 programming threshold voltage states. In addition, for example, if the bit number of the written data is 3, the written data may have eight logic values, that is, 0 to 7, and the corresponding storage transistor shall have 7 programming threshold voltage states.

According to an embodiment of the present disclosure, by setting different threshold voltage states of the first storage transistor MS 110 and the second storage transistor MD 130, different logic values may be stored in the first storage transistor MS 110 and the second storage transistor MD 130, thereby implementing a multi-value programming function.

Figure 12:
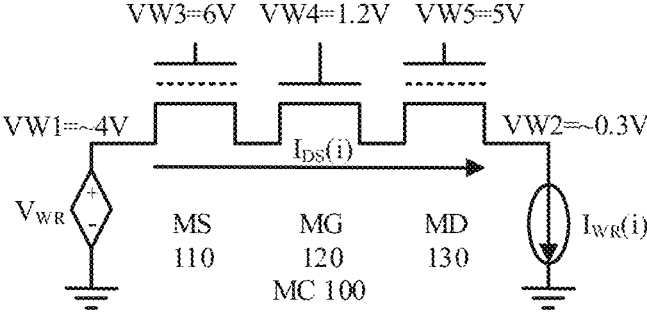
FIG. 12 illustrates a schematic circuit diagram of a multi-value programing operation of the first storage transistor according to an embodiment of the present disclosure.

FIG. 12 illustrates a schematic circuit diagram of a multi-value programming operation of the first storage transistor MS 110 according to one embodiment of the present disclosure.

As shown in FIG. 12, according to one embodiment of the present disclosure, the constant current load may apply different currents $I_{WR}(i)$ according to different logic values of the written data, resulting in different on-currents $I_{DS}(i)$ of the flash memory cell MC 100, so that the first storage transistor MS 110 has different programming threshold voltage states. Here, $0 \leq i \leq N$, N denotes the number of logic values of the written data.

Figure 13:
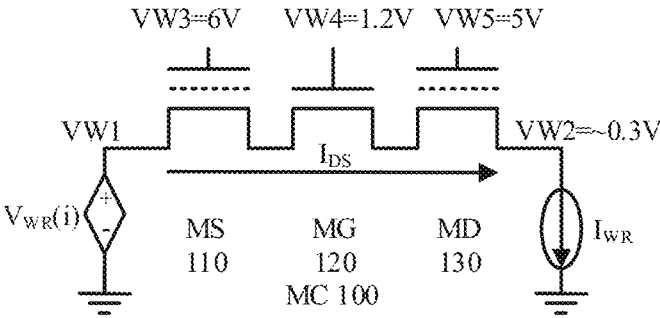
FIG. 13 illustrates a schematic circuit diagram of a multi-value programing operation of the first storage transistor according to another embodiment of the present disclosure.

In addition, FIG. 13 illustrates a schematic circuit diagram of a multi-value programing operation of the first storage transistor MS 110 according to another embodiment of the present disclosure.

As shown in FIG. 13, according to another embodiment of the present disclosure, the external constant voltage source may adjust the magnitude of its constant voltage $V_{WR}(i)$ according to different logic values of the written data, such that the first storage transistor MS 110 has different programmed threshold voltage states. Here, $0 \leq i \leq N$, N denotes the number of logic values of the written data. Under this configuration condition, the source-drain on-current ($I_{DS}$) is kept constant, by applying different voltage magnitudes, the electric field at the drain may be adjusted, thereby different injection probabilities $P_{INJ}$ and different programming currents may be obtained, so as to obtain different programming threshold voltage states.

Figure 14:
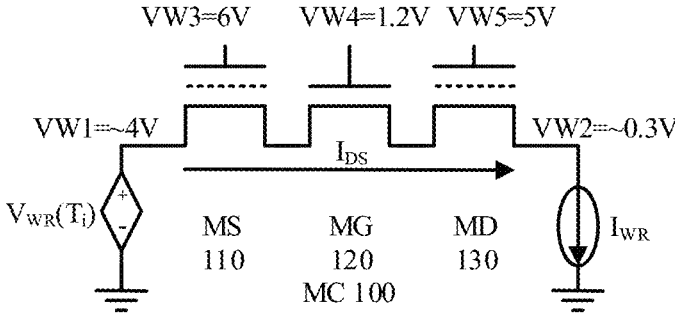
FIG. 14 illustrates a schematic circuit diagram of a multi-value programing operation of the first storage transistor according to yet another embodiment of the present disclosure.

FIG. 14 illustrates a schematic circuit diagram of a multi-value programing operation of the first storage transistor MS 110 according to yet another embodiment of the present disclosure.

As shown in FIG. 14, according to yet another embodiment of the present disclosure, the external constant voltage source may adjust the application time (that is, the voltage pulse width) of its constant voltage $V_{WR}(Ti)$ (that is, the first writing voltage VW1) according to different logic values of the written data, such that the first storage transistor MS 110 has different programmed threshold voltage states. Here, $0 \leq i \leq N$, N denotes the number of logic values of the written data. Under this configuration condition, the programming current is kept constant, different amounts of charge may be injected into the storage charge layer of the first storage transistor MS 110 by applying different voltage pulse widths, and then different programming threshold voltage states are obtained.

Figure 15:
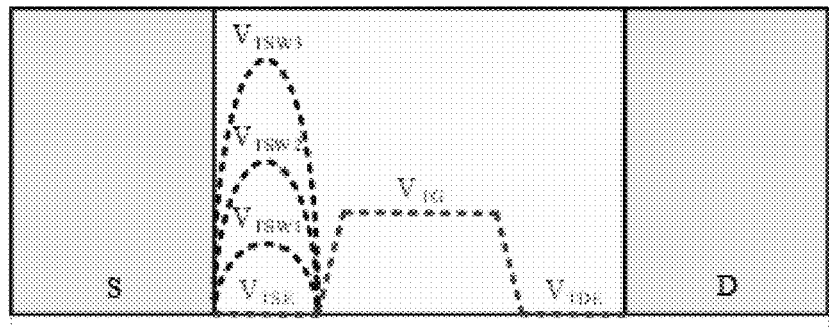
FIG. 15 illustrates a schematic diagram of the threshold voltage of a multi-value programing operation of the first storage transistor according to an embodiment of the present disclosure.

FIG. 15 illustrates a schematic diagram of a multi-value programing operation of the first storage transistor MS 110 according to an embodiment of the present disclosure. As shown in FIG. 15, by setting three different threshold voltages $V_{TSW1}$, $V_{TSW2}$, and $V_{TSW3}$ of the first storage transistor MS 110, four logic values, that is, 0, 1, 2, 3, may be stored in the first storage transistor MS 110. That is, the above-mentioned value of N is 4. In FIG. 15, $V_{TG}$ denotes the threshold voltage of the selection transistor MG 120, $V_{TSE}$ and $V_{TDE}$ denote the threshold voltages of the first storage transistor MS 110 and the second storage transistor MD 130 in an erased state, respectively.

Figure 16:
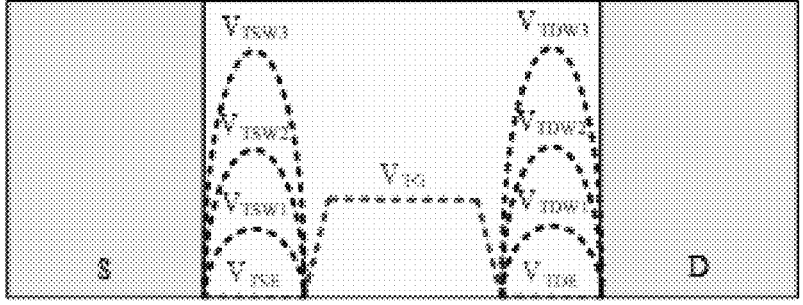
FIG. 16 illustrates a schematic diagram of the threshold voltage of a multi-value programing operation of the second storage transistor according to an embodiment of the present disclosure.

Similarly, FIG. 16 illustrates a schematic diagram of a multi-value programing operation of the second storage transistor MD 130 according to an embodiment of the present disclosure. As shown in FIG. 16, by setting three different threshold voltages $V_{TDW1}$, $V_{TDW2}$, and $V_{TDW3}$ of the second storage transistor MD 130, four logic values, that is, 0, 1, 2, 3, may be stored in the second storage transistor MD 130. In FIG. 16, $V_{TG}$ denotes the threshold voltage of the selection transistor MG 120, $V_{TSE}$ and $V_{TDE}$ denote the threshold voltages of the first storage transistor MS 110 and the second storage transistor MD 130 in the erased state, respectively.

It should be noted that, during the writing operation or the multi-value programing operation of the first storage transistor MS 110 shown in FIGS. 8 and 15, the second storage transistor MD 130 is preset in the erased state. However, according to the principles of the embodiments of the present disclosure, the second storage transistor MD 130 is fully turned on by the fifth writing voltage VW5, and thus the writing operation or the multi-value programing operation of the first storage transistor MS 110 may not be affected by the threshold voltage of the second storage transistor MD 130, that is, the second storage transistor MD 130 may also be in a writing state when the writing operation or the multi-value programing operation is performed on the first storage transistor MS 110. Similarly, during the writing operation or the multi-value programming operation of the second storage transistor MD 130 shown in FIGS. 9 and 16, the first storage transistor MS 110 may be in either the writing or the erased state. Similarly, the order of the writing operations or the multi-value programming operations of the first storage transistor MS 110 and the second storage transistor MD 130 are not limited.

According to an embodiment of the present disclosure, by storing data having a plurality of logic values in the first storage transistor MS 110 and the second storage transistor MD 130 of the flash memory cell MC 100, the storage density may be increased. Moreover, as shown in FIGS. 15 and 16, since the selection transistor MG 120 of the flash memory cell MC 100 may isolate the first storage transistor MS 110 and the second storage transistor MD 130, thereby avoiding mutual influence therebetween, a larger storage window may be obtained, thereby enabling the multi-value programing operation according to the present disclosure to have better data reliability.

According to an embodiment of the present disclosure, since the programming (writing) operations of the first storage transistor MS 110 and the second storage transistor MD 130 are separately performed, the number of logic values stored therein may be different, for example, 1-bit data may be stored in the first storage transistor MS 110, while at least 2-bit data may be stored in the second storage transistor MD 130.

The multi-value programming method according to the present disclosure may obtain a more precise programming threshold voltage by adjusting the constant current of the externally connected constant current load, and thus the threshold distribution characteristics and reliability of the multi-value programming operation are substantially improved. In addition, the multi-value programming method according to the present disclosure may write different data logic values simultaneously by using different constant current loads, so that a higher multi-value programming operation speed may be achieved as compared with the existing ISPP (Incremental Step Pulse Programming) multi-value programming method in which the voltage magnitude and the number of pulses written in the gate of a storage transistor are increased.

Figure 17:
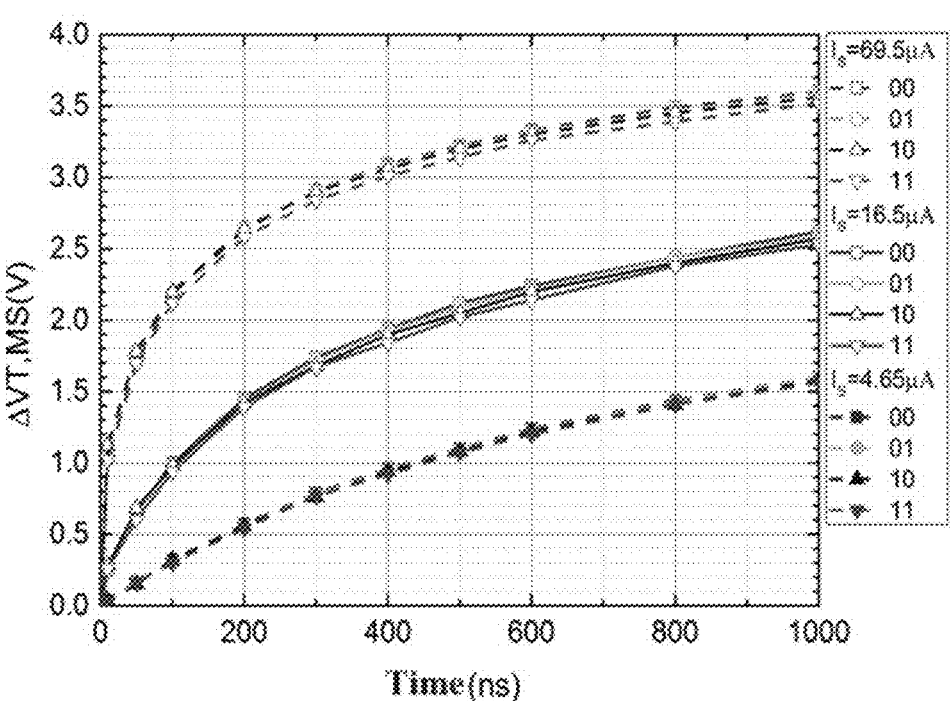
FIG. 17 illustrates a graph of the programming threshold voltage as a function of the programming time under writing current conditions of different constant current loads according to an embodiment of the present disclosure.

FIG. 17 illustrates a graph of the programming threshold voltage as a function of the programming time under writing current conditions of different constant current loads according to an embodiment of the present disclosure.

In FIG. 17, the abscissa represents time in nanoseconds (ns), and the ordinate represents the change amount $\Delta V_{T, MS}$ of the threshold voltage of the first storage transistor MS 110 in volts (V). As shown in FIG. 17, according to an embodiment of the present disclosure, the respective programming threshold voltages for the respective logic values 00, 01, 10, and 11 are substantially proportional to the writing current $I_S$ of the constant current load, so that proportional programming threshold voltage states may be obtained at the same programming time.

Specifically, the multi-value writing method of the flash memory cell MC 100 according to an embodiment of the present disclosure may be performed in the following manner. When performing the writing operation on the first storage transistor MS 110 of the flash memory cell MC 100, the first writing voltage VW1 is applied to the first electrode S, the second writing voltage VW2 is applied to the second electrode D, the third writing voltage VW3 is applied to the gate electrode 116 of the first storage transistor MS 110, the fourth writing voltage VW4 is applied to the gate electrode 123 of the selection transistor MG 120, and the fifth writing voltage VW5 is applied to the gate electrode 136 of the second storage transistor MD 130. In addition, the magnitude of the current $I_{WR}$ of the constant current load is set according to the logic value of data to be written to the first storage transistor MS 110, to write the corresponding data to the first storage transistor MS 110. The multi-value writing method of the second storage transistor MD 130 of the flash memory cell MC 100 is similar to the multi-value writing method of the first storage transistor MS 110 of the flash memory cell MC 100 described above, and therefore, for brevity, will not be described in further detail herein.

In addition, the multi-value writing method of the flash memory cell MC 100 according to an embodiment of the present disclosure may also be performed in the following manner. When performing the writing operation on the first storage transistor MS 110 of the flash memory cell MC 10, the first writing voltage VW1 is applied to the first electrode S, the second writing voltage VW2 is applied to the second electrode D, a third writing voltage VW3 is applied to the gate electrode 116 of the first storage transistor MS 110, the fourth writing voltage VW4 is applied to the gate electrode 123 of the selection transistor MG 120, and the fifth writing voltage VW5 is applied to the gate electrode 136 of the second storage transistor MD 130. In addition, the application time of the first writing voltage VW1 is set according to the logic value of the data to be written to the first storage transistor MS 110, to write the corresponding data to the first storage transistor MS 110. The multi-value writing method of the second storage transistor MD 130 of the flash memory cell MC 100 is similar to the multi-value writing method of the first storage transistor MS 110 of the flash memory cell MC 100 described above, and therefore, for brevity, will not be described in further detail herein.

It should be noted that in the prior art, the multi-value programming operation is typically implemented using the ISPP method, that is, the different threshold voltage states of the storage transistor are set by gradually increasing the gate voltage and the number of pulses of the storage transistor step. This ISPP multi-value programming operation method is only applicable to the NAND type flash memory cell which performs the writing operation based on FN (Fowler-Nordheim) tunneling effect, and not applicable to the NOR type flash memory cell which is based on the channel hot carrier injection mechanism as described herein. In contrast, as described above, by adjusting the constant current of the externally connected constant current load or the voltage application time of the constant voltage source, the different threshold voltage states of the storage transistor may be accurately set, thereby implementing the multi-value writing operation of the storage transistor.

Accordingly, those skilled in the art should appreciate that although the writing method (including the multi-value writing method) of the flash memory cell of the present disclosure is described above in connection with the flash memory cell MC 100 shown in FIG. 1, the writing method of the flash memory cell of the present disclosure is not limited to the flash memory cell MC 100 shown in FIG. 1. Those skilled in the art may envisage, according to the teaching of the present disclosure, that the writing method of the flash memory cell of the present disclosure is applied to other types of flash memory cell, such as a flash memory cell including only one storage transistor or a flash memory cell using one storage transistor to store 2-bit data, all of which should fall within the scope of the present disclosure.

Figure 18:
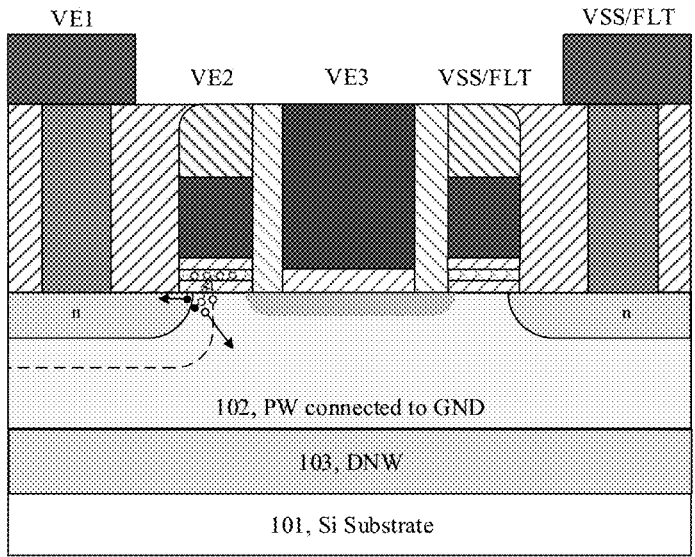
FIG. 18 illustrates a schematic diagram of performing an erasing operation on the first storage transistor by a first erasing step according to an embodiment of the present disclosure.
Figure 19:
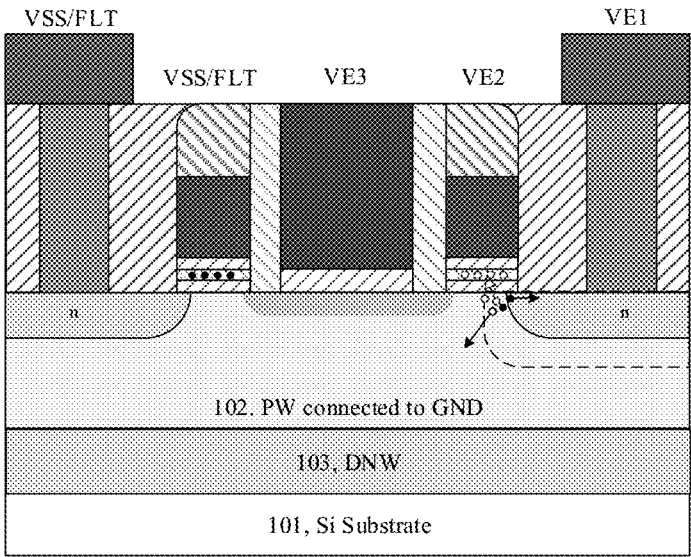
FIG. 19 illustrates a schematic diagram of performing an erasing operation on the second storage transistor by the first erasing step according to an embodiment of the present disclosure.

FIG. 7 illustrates the equivalent circuit diagram of the flash memory cell MC 100 according to an embodiment of the present disclosure. FIG. 18 illustrates a schematic diagram of performing an erasing operation on the first storage transistor MS 110 by a first erasing step according to an embodiment of the present disclosure. FIG. 19 illustrates a schematic diagram of performing an erasing operation on the second storage transistor MD 130 by the first erasing step according to an embodiment of the present disclosure.

Specifically, as shown in FIG. 7, the flash memory cell MC 100 includes the first storage transistor MS 110, the selection transistor MG 120, and a second storage transistor MD 130 sequentially connected in series. The selection transistor MG 120 may isolate the first storage transistor MS 110 and the second storage transistor MD 130 and perform the selection operation on the first storage transistor MS 110 and the second storage transistor MD 130. As shown in FIG. 7, by controlling voltages applied to the source region (that is, the first electrode S) of the first storage transistor MS 110, the gate electrode 116 of the first storage transistor MS 110, the gate electrode 123 of the selection transistor MG 120, the gate electrode 136 of the second storage transistor MD 130, and the drain region (that is, the second electrode D) of the second storage transistor MD 130, the erasing operations on the first storage transistor MS 110 or the second storage transistor MD 130 may be implemented, respectively.

According to an embodiment of the present disclosure, when the erasing operation is performed on the flash memory cell MC 100, the well region PW 102 of the flash memory cell MC 100 may be connected to the ground.

Specifically, according to an embodiment of the present disclosure, as shown in FIG. 18, when performing the erasing operation on the first storage transistors MS 110 of the flash memory cell MC 100 by the first erasing step, the first erasing step of the erasing method according to the present disclosure includes applying the second power voltage VSS to the well region PW 102, applying a first erasing voltage VE1 to the first electrode S, applying the second power voltage VSS to or floating the second electrode D (FLT), applying a second erasing voltage VE2 to the gate electrode 116 of the first storage transistor MS 110, applying a third erasing voltage VE3 to the gate electrode 123 of the selection transistor MG 120, and applying the second power voltage VSS to or floating the gate electrode 136 of the second storage transistor MD 130. For example, the second power voltage VSS may be the ground voltage, for example, 0 V.

According to an embodiment of the present disclosure, the first erasing voltage VE1 is higher than a preset voltage VP, which is predetermined according to the carrier barrier height at the interface between the substrate and the gate dielectric stack 112 of the first storage transistor MS 110. For example, in the flash memory cell MC 100 shown in FIG. 18, the preset voltage VP may enable holes to cross the hole barrier at the interface between the P-type channel region 111 and the lower first oxide layer (tunneling oxide) 113 in the gate dielectric stack 112. For example, in the case where the P-type channel region 111 includes silicon and the first oxide layer 113 includes silicon dioxide, the barrier height is 4.8 electron volts (eV). In this case, the first erasing voltage VE1 is typically higher than 4 volts (V). For example, the first erasing voltage VE1 may be in a range of 3 V to 8 V. For example, the first erasing voltage VE1 may be 4 V.

According to an embodiment of the present disclosure, the second erasing voltage VE2 is equal to or lower than the second power voltage VSS, which may be the ground voltage GND. Further, according to an embodiment of the present disclosure, the second erasing voltage VE2 may be in a range of −8 V to 0 V. For example, the second erasing voltage may be −6 V.

According to an embodiment of the present disclosure, the third erasing voltage VE3 may be equal to or lower than the second power voltage VSS.

Similarly, according to an embodiment of the present disclosure, as shown in FIG. 19, when performing the erasing operation on the second storage transistors MD 130 of the flash memory cell MC 100 by the first erasing step, the first erasing step of the erasing method according to the present disclosure includes applying the second power voltage VSS to or floating the first electrode S, applying the first erasing voltage VET to the second electrode D, applying the second power voltage VSS to or floating the gate electrode 116 of the first storage transistor MS 110, applying the third erasing voltage VE3 to the gate electrode 123 of the selection transistor MG 120, and applying the second erasing voltage VE2 to the gate electrode 136 of the second storage transistor MD 130.

As can be seen, because of the symmetrical structure of the flash memory cell MC 100, there is also a symmetrical relationship between the respective erasing voltages VET to VW3 applied during erasing of the first storage transistor MS 110 and the second storage transistor MD 130 using the first erasing step. Therefore, repetitive description of the erasing voltages applied during the erasing operation of the second storage transistor MD 130 is not made here for brevity.

In addition, according to an embodiment of the present disclosure, the erasing operation may also be simultaneously performed on the first storage transistor MS 110 and the second storage transistor MD 130 of the flash memory cell MC 100 by a second erasing step.

Figure 20:
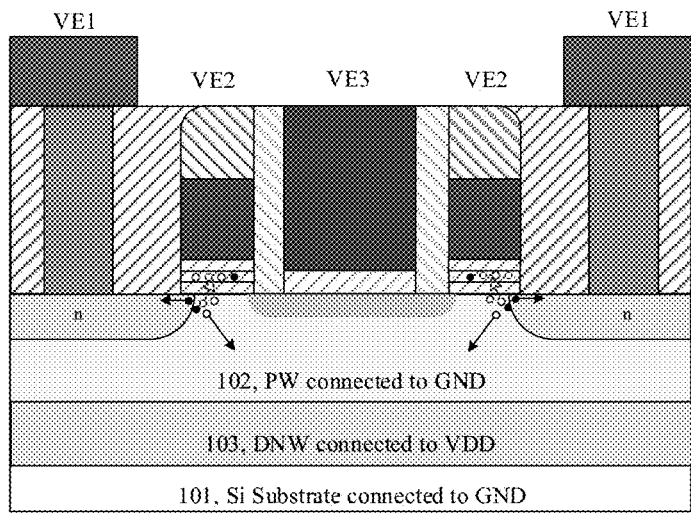
FIG. 20 illustrates a schematic diagram of performing an erasing operation on the flash memory cell by a second erasing step according to an embodiment of the present disclosure.

FIG. 20 illustrates a schematic diagram of performing an erasing operation on the flash memory cell by a second erasing step according to an embodiment of the present disclosure.

According to an embodiment of the present disclosure, as shown in FIG. 20, when simultaneously performing the erasing operation on the first storage transistor MS 110 and the second storage transistor MD 130 by the second erasing step, the second erasing step of the erasing method according to the present disclosure includes applying the second power voltage VSS to the well region PW 102, applying the first erasing voltage VET to the first electrode S and the second electrode D, applying the third erasing voltage VE3 to the gate electrode 123 of the selection transistor MG 120, and applying the second erasing voltage VE2 to the gate electrode 116 of the first storage transistor MS 110 and the gate electrode 136 of the second storage transistor MD 130.

According to an embodiment of the present disclosure, the erasing operations performed on the first storage transistor MS 110 and the second storage transistor MD 130 by the first erasing step and the second erasing step described above adopt a band-to-band tunneling hot carrier injection mechanism. Taking the erasing operation on the first storage transistor MS 110 as an example, the junction at the first electrode S of the flash memory cell MC 100 is in a high voltage reverse bias state, and therefore, under the action of the second erasing voltage VE2 (a negative gate voltage) applied to the gate electrode 116, the band-to-band tunneling physical mechanism occurs in the depletion region of the junction, and the hot holes generated by the band-to-band tunneling are injected into the storage dielectric layer 114 such as silicon nitride. The hot holes may recombine with the electrons stored during the writing (programming) operation of the flash memory cell MC 100, such that the threshold voltage of the first storage transistor MS 110 decreases. In addition, since the flash memory cell MC 100 is in an off-state at this time, this erasing operation does not result in an on-current, so that this erasing method of the flash memory cell according to the present disclosure has the advantage of low power consumption.

Figure 21:
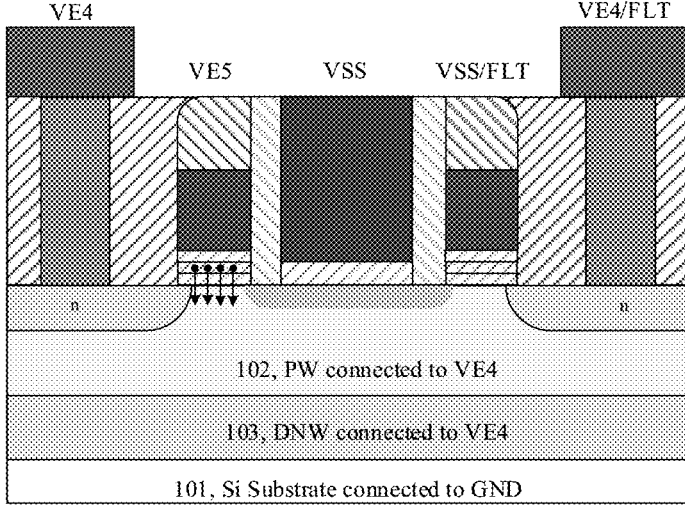
FIG. 21 illustrates a schematic diagram of performing an erasing operation on the first storage transistor by a third erasing step according to an embodiment of the present disclosure.
Figure 22:
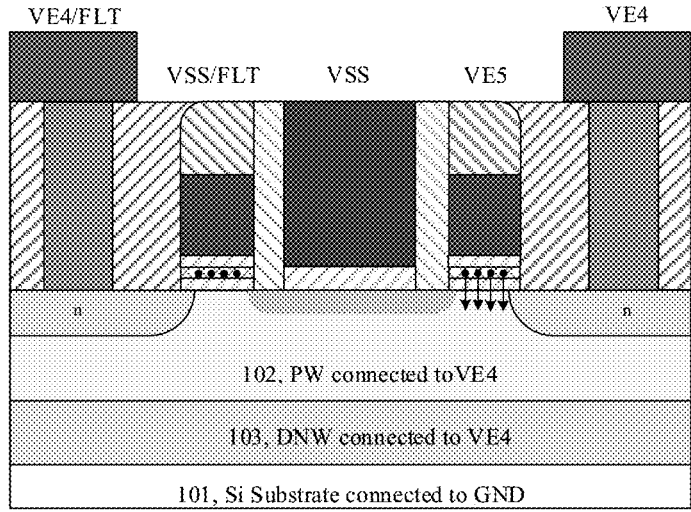
FIG. 22 illustrates a schematic diagram of performing an erasing operation on the second storage transistor by a third erasing step according to an embodiment of the present disclosure.

According to an embodiment of the present disclosure, the erasing operation may also be performed on the flash memory cell MC 100 by a third erasing step of the erasing method of the flash memory cell according to the present disclosure. FIG. 21 illustrates a schematic diagram of performing an erasing operation on the first storage transistor MS 110 by a third erasing step according to an embodiment of the present disclosure. FIG. 22 illustrates a schematic diagram of performing an erasing operation performed on the second storage transistor MD 130 by the third erasing step according to an embodiment of the present disclosure.

Specifically, according to an embodiment of the present disclosure, as shown in FIG. 21, when performing the erasing operation on the first storage transistors MS 110 of the flash memory cell MC 100 by the third erasing step, the third erasing step of the erasing method according to the present disclosure includes applying a fourth erasing voltage VE4 to the well region PW 102 and the first electrode S, applying the fourth erasing voltage VE4 to or floating the second electrode D, applying a fifth erasing voltage VE5 to the gate electrode 116 of the first storage transistor MS 110, applying the second power voltage VSS to the gate electrode 123 of the selection transistor MG 120, and applying the second power voltage VSS to or floating the gate electrode 136 of the second storage transistor MD 130.

According to an embodiment of the present disclosure, the fourth erasing voltage VE4 may be equal to or higher than the second power voltage VSS, and in a range of 0 V to 20 V. For example, the fourth erasing voltage VE4 may be 6 V. In addition, according to an embodiment of the present disclosure, the fifth erasing voltage VE5 may be equal to or lower than the second power voltage VSS, and in a range of −10 V to 0 V. For example, the fifth erasing voltage VE5 may be −6 V.

In addition, according to an embodiment of the present disclosure, as shown in FIG. 22, when performing the erasing operation on the second storage transistors MD 130 of the flash memory cell MC 100 by the third erasing step, the third erasing step of the erasing method according to the present disclosure includes applying the fourth erasing voltage VE4 to or floating the first electrode S, applying the fourth erasing voltage VE4 to the well region PW 102 and the second electrode D, applying the second power voltage VSS to or floating the gate electrode 116 of the first storage transistor MS 110, applying the second power voltage VSS to the gate electrode 123 of the selection transistor MG 120, and applying the fifth erasing voltage VE5 to the gate electrode 136 of the second storage transistor MD 130.

As can be seen, because of the symmetrical structure of the flash memory cell MC 100, there is also a symmetrical relationship between the respective erasing voltages VE5 and VW4 applied during erasing of the first storage transistor MS 110 and the second storage transistor MD 130 using the third erasing step. Therefore, repetitive description of the erasing voltages applied during the erasing operation of the second storage transistor MD 130 is not made here for brevity.

In addition, according to an embodiment of the present disclosure, the erasing operation may also be simultaneously performed on the first storage transistor MS 110 and the second storage transistor MD 130 of the flash memory cell MC 100 by a fourth erasing step. According to an embodiment of the present disclosure, when performing the erasing operation simultaneously on the first storage transistor MS 110 and the second storage transistor MD 130, the fourth erasing step of the erasing method according to the present disclosure includes applying the fourth erasing voltage VE4 to the well region PW 102, the first electrode S, and the second electrode D, applying the second power voltage VSS to the gate electrode 123 of the selection transistor MG 120, and applying the second erasing voltage VE2 to the gate electrode 116 of the first storage transistor MS 110 and the gate electrode 136 of the second storage transistor MD 130.

According to an embodiment of the present disclosure, the erasing operations performed on the first storage transistor MS 110 and the second storage transistor MD 130 by the third erasing step and the fourth erasing step described above adopt an FN (Fowler-Nordheim) tunneling mechanism. Taking the erasing operation on the first storage transistor MS 110 as an example, the fourth erasing voltage VE4, which is a relatively high voltage, is applied to the first electrode S and the well region PW 102 (substrate) of the flash memory cell MC 100, the fifth erasing voltage VE5, which is a negative voltage or ground voltage, is applied to the gate electrode 116 (controlling gate) of the first storage transistor MS 110, and therefore, under the action of the gate reverse electric field, the written electron charges stored in the storage dielectric layer 114 is pulled out from the substrate through the FN tunneling mechanism, such that the threshold voltage of the first storage transistor MS 110 decreases. In addition, since the flash memory cell MC 100 is in an off-state at this time and there is no voltage difference between the first electrode S and the second electrode D thereof, this erasing operation does not result in an on-current, so that this erasing method of the flash memory cell according to the present disclosure has the advantage of low power consumption.

It should be explained that the erasing operations of the third erasing step and the fourth erasing step based on the FN tunneling mechanism according to the present disclosure have a lower operation current than the erasing operation based on the band-to-band tunneling hot hole injection mechanism, and therefore, is suitable for erasing more rows of flash memory cells simultaneously and thus supports the erasing operation of the flash memory cell array with larger capacity. However, because of the trap trapping mechanism of written (programmed) electron charges in the storage dielectric layer such as silicon nitride, it is difficult for the trapping electrons to be excited by a longitudinally reverse electric field away from the electron traps and tunneled into the substrate. As such, the erasing operations of the third erasing step and the fourth erasing step based on the FN tunneling mechanism has a higher erasing voltage, a slower operation speed and a smaller erasing window compared with the erasing operations of the first erasing step and the second erasing step based on the band-to-band tunneling hot carrier injection mechanism.

In view of the property of the erasing operations of the first erasing step and the second erasing step based on the band-to-band tunneling hot carrier injection mechanism and the erasing operations of the third erasing step and the fourth erasing step based on the FN tunneling mechanism, according to an embodiment of the present disclosure, an erasing method of the flash memory cell may include first performing an erasing operation on the flash memory cell by the third erasing step or the fourth erasing step, and subsequently performing an erasing operation on the flash memory cell by the first erasing step or the second erasing step.

Figure 23:
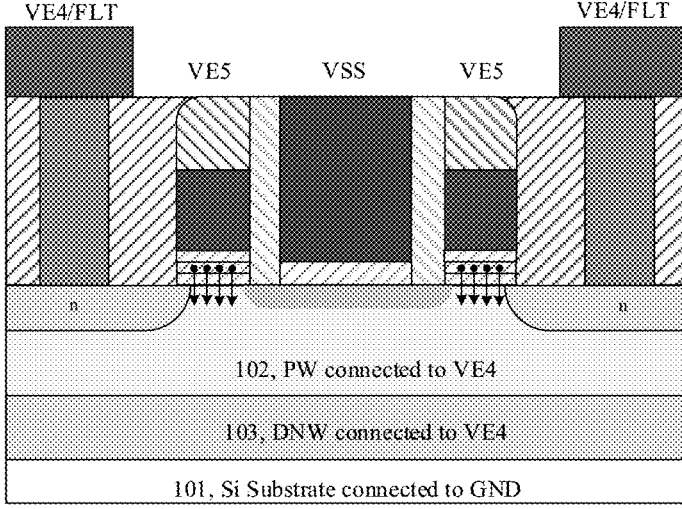
FIG. 23 illustrates a schematic diagram of performing an erasing operation on the flash memory cell by a fourth erasing step according to an embodiment of the present disclosure.

Preferably, as shown in FIG. 23, firstly the erasing operation is performed on the flash memory cells using the fourth erasing step based on the FN tunneling mechanism, such that the characteristic of small operation current of the FN tunneling mechanism is utilized, and more flash memory cells are selected to perform the erasing operation simultaneously, so as to erase the threshold voltages of the selected flash memory cells (storage transistors) to a lower state. Subsequently, as shown in FIG. 20, the erasing operation is performed on the flash memory cells using the second erasing step based on the band-to-band tunneling hot carrier injection mechanism, thereby erasing the selected flash memory cells (storage transistors) to a much lower threshold voltage state using recombination of the injected holes.

By the multi-step combined erasing method according to an embodiment of the present disclosure, the first erasing step or the second erasing step can be combined with the third erasing step or the fourth erasing step, to obtain a lower erasing threshold voltage while decreasing the erasing voltage and the erasing time, thereby improving the erasing operation speed and increasing the erasing operation threshold voltage window of the flash memory cell and the reliability of storage.

Those skilled in the art should appreciate that although the erasing method of the flash memory cell of the present disclosure is described above in connection with the flash memory cell MC 100 shown in FIG. 1, the erasing method of the flash memory cell of the present disclosure is not limited to the flash memory cell MC 100 shown in FIG. 1. Those skilled in the art may envisage, according to the teaching of the present disclosure, that the erasing method of the flash memory cell of the present disclosure is applied to other types of flash memory cell, such as a flash memory cell including only one storage transistor or a flash memory cell using one storage transistor to store 2-bit data, all of which should fall within the scope of the present disclosure.

The present disclosure may also include, but is not limited to, the following solutions:

Solution 1. An erasing method of a flash memory cell, comprising sequentially performing a first erasing step and a second erasing step, wherein the first erasing step performs an erasing operation on the flash memory cell by an FN tunneling mechanism, and wherein the second erasing step performs an erasing operation on the flash memory cell by a band-to-band tunneling hot carrier injection mechanism.

Solution 2. The erasing method according to Solution 1, wherein the flash memory cell comprises:

a substrate including a deep well region and a well region disposed on the deep well region;

a first storage transistor disposed on the well region and configured to store first data;

a second storage transistor disposed on the well region and configured to store second data; and a selection transistor disposed between the first storage transistor and the second storage transistor in a horizontal direction on the well region, configured to isolate the first storage transistor and the second storage transistor and perform a selection operation on the first storage transistor and the second storage transistor, wherein the first storage transistor, the selection transistor and the second storage transistor are sequentially connected in series, and wherein a source region of the first storage transistor is connected to a first electrode of the flash memory cell, and a drain region of the second storage transistor is connected to a second electrode of the flash memory cell.

Solution 3. The erasing method according to Solution 1, wherein the second erasing step comprises:

performing an erasing operation on the first storage transistor by applying a second power voltage to the well region, applying a first erasing voltage to the first electrode, applying the second power voltage to the second electrode or floating the second electrode, applying a second erasing voltage to a gate electrode of the first storage transistor, applying a third erasing voltage to a gate electrode of the selection transistor, and applying the second power voltage to or floating a gate electrode of the second storage transistor; and performing an erasing operation on the second storage transistor by applying the second power voltage to the well region, applying the second power voltage to or floating the first electrode, applying the first erasing voltage to the second electrode, applying the second power voltage to or floating the gate electrode of the first storage transistor, applying the third erasing voltage to the gate electrode of the selection transistor, and applying the second erasing voltage to the gate electrode of the second storage transistor, wherein the first erasing voltage is higher than a preset voltage, the second erasing voltage is equal to or lower than the second power voltage, and the third erasing voltage is equal to or lower than the second power voltage, and wherein the preset voltage is predetermined based on a carrier barrier height at an interface between the substrate and gate dielectric stacks of the first storage transistor and the second storage transistor.

Solution 4. The erasing method according to Solution 1, wherein the second erasing step comprises:

performing an erasing operation on the first storage transistor and the second storage transistor simultaneously by applying a second power voltage to the well region, applying a first erasing voltage to the first electrode and the second electrode, applying a third erasing voltage to a gate electrode of the selection transistor, and applying a second erasing voltage to the gate electrodes of the first storage transistor and the second storage transistor, wherein the first erasing voltage is higher than a preset voltage, the second erasing voltage is equal to or lower than the second power voltage, and the third erasing voltage is equal to or lower than the second power voltage, and wherein the preset voltage is determined based on a carrier barrier height at an interface between the substrate and a gate dielectric stack of the first storage transistor and the second storage transistor.

Solution 5. The erasing method according to Solution 3 or 4, wherein the second power voltage is a ground voltage, the first erasing voltage is in a range of 3 V to 8 V, and the second erasing voltage is in a range of −8V to 0V.

Solution 6. The erasing method according to Solution 1, wherein the first erasing step comprises:

performing an erasing operation on the first storage transistor by applying a fourth erasing voltage to the well region and the first electrode, applying the fourth erasing voltage to or floating the second electrode, applying a fifth erasing voltage to a gate electrode of the first storage transistor, by applying a second power voltage to a gate electrode of the selection transistor, and applying the second power voltage to or floating a gate electrode of the second storage transistor; and performing an erasing operation on the second storage transistor by applying the fourth erasing voltage to or floating the first electrode, applying the fourth erasing voltage to the well region and the second electrode, applying the second power voltage to or floating the gate electrode of the first storage transistor, applying the second power voltage to the gate electrode of the selection transistor, and applying the fifth erasing voltage to the gate electrode of the second storage transistor, wherein the second power voltage is a ground voltage, the fourth erasing voltage is in a range of 0 V to 20 V, and the fifth erasing voltage is in a range of −10 V to 0 V.

Solution 7. The erasing method according to Solution 1, wherein the first erasing step comprises:

performing an erasing operation on the first storage transistor and the second storage transistor simultaneously by applying a fourth erasing voltage to the well region, the first electrode, and the second electrode, applying a second power voltage to a gate electrode of the selection transistor, and applying a fifth erasing voltage to the gate electrodes of the first storage transistor and the second storage transistor, wherein the second power voltage is a ground voltage, the fourth erasing voltage is in a range of 0 V to 20 V, and the fifth erasing voltage is in a range of −10 V to 0 V.

Although the present disclosure has been described with reference to the embodiments thereof, those skilled in the art should appreciate that various modifications and changes may be made to the present disclosure without departing from the spirit and scope of the present disclosure as disclosed in the attached claims.

The invention claimed is:

1. A flash memory cell comprising:

a substrate including a deep well region and a well region disposed on the deep well region;

a first storage transistor disposed on the well region and configured to store first data;

a second storage transistor disposed on the well region and configured to store second data; and a selection transistor disposed between the first storage transistor and the second storage transistor in a horizontal direction on the well region, configured to isolate the first storage transistor and the second storage transistor and to perform a selection operation on the first storage transistor and the second storage transistor, wherein the first storage transistor, the selection transistor and the second storage transistor are connected in series, wherein a source region of the first storage transistor is connected to a first electrode of the flash memory cell, and a drain region of the second storage transistor is connected to a second electrode of the flash memory cell, and wherein the first storage transistor and the second storage transistor have a gate structure including a channel region, a gate dielectric stack, a gate electrode and a hard mask blocking portion sequentially disposed in a vertical direction, and the gate dielectric stack has a first oxide layer, a storage dielectric layer and a second oxide layer sequentially stacked in the vertical direction.

2. The flash memory cell according to claim 1, wherein a gate electrode of the selection transistor has eave portions extending above the gate electrode of the first storage transistor and the gate electrode of the second storage transistor in a horizontal direction, and the eave portion is isolated from the gate electrode of the first storage transistor and the gate electrode of the second storage transistor by the hard mask blocking portion.

3. The flash memory cell according to claim 1, wherein the storage dielectric layer comprises one or more layers of storage dielectric.

4. The flash memory cell according to claim 3, wherein the storage dielectric includes at least one of the following materials: mono-element or multi-element oxide, mono-element or multi-element nitride, mono-element or multi-element oxynitride, polysilicon and nano-crystal material.

5. The flash memory cell according to claim 1, further comprising:

a first isolation portion disposed between the first storage transistor and the selection transistor in the horizontal direction and configured to isolate the gate electrode of the first storage transistor from the gate electrode of the selection transistor; and a second isolation portion disposed between the selection transistor and the second storage transistor in the horizontal direction, configured to isolate the gate electrode of the selection transistor and the gate electrode of the second storage transistor.

6. The flash memory cell according to claim 1, wherein channel regions of the first storage transistor, the second storage transistor, and the selection transistor have a first doping type, and the doping concentration of the channel regions of the first storage transistor and the second storage transistor is lower than the doping concentration of the channel region of the selection transistor.

7. The flash memory cell according to claim 1, wherein channel regions of the first storage transistor and the second storage transistor have a second doping type or are undoped intrinsic channel regions, and the channel region of the selection transistor has a first doping type different from the second doping type.

8. The flash memory cell according to claim 1, wherein the length of the gate electrodes of the first storage transistor and the second storage transistor is defined by the length of the hard mask blocking portion disposed on the gate electrodes of the first storage transistor and the second storage transistor.

9. A writing method of a flash memory cell, which comprises:

a substrate including a deep well region and a well region disposed on the deep well region;

a first storage transistor disposed on the well region and configured to store first data;

a second storage transistor disposed on the well region and configured to store second data; and a selection transistor disposed between the first storage transistor and the second storage transistor in a horizontal direction on the well region, configured to isolate the first storage transistor and the second storage transistor and to perform a selection operation on the first storage transistor and the second storage transistor, wherein the first storage transistor, the selection transistor and the second storage transistor are connected in series, and wherein a source region of the first storage transistor is connected to a first electrode of the flash memory cell, and a drain region of the second storage transistor is connected to a second electrode of the flash memory cell, the writing method comprising:

performing a writing operation on the first storage transistor by applying a first writing voltage to the first electrode, applying a second writing voltage to the second electrode, applying a third writing voltage to a gate electrode of the first storage transistor, applying a fourth writing voltage to a gate electrode of the selection transistor, and applying a fifth writing voltage to a gate electrode of the second storage transistor; and performing a writing operation on the second storage transistor by applying the second writing voltage to the first electrode, applying the first writing voltage to the second electrode, applying the fifth writing voltage to the gate electrode of the first storage transistor, applying the fourth writing voltage to the gate electrode of the selection transistor, and applying the third writing voltage to the gate electrode of the second storage transistor, wherein the fourth writing voltage is equal to or lower than a first power voltage, the second writing voltage is equal to or higher than a second power voltage, the first writing voltage is higher than a preset voltage, and the third writing voltage is higher than the first writing voltage, wherein the first power voltage is higher than the second power voltage, wherein the preset voltage is predetermined based on a carrier barrier height at an interface between the substrate and gate dielectric stacks of the first storage transistor and the second storage transistor, wherein the first writing voltage, the fourth writing voltage, and the fifth writing voltage are higher than the second writing voltage, wherein the second writing voltage is connected to the second power voltage through a constant current load, and wherein, during a writing operation of the flash memory cell, the first writing voltage, the second writing voltage, the third writing voltage, the fourth writing voltage, and the fifth writing voltage turn on all the first storage transistor, the second storage transistor, and the selection transistor.

10. The writing method according to claim 9, wherein the first power voltage is in a range of 0.8 V to 5 V, the second power voltage is a ground voltage, the first writing voltage is in a range of 3 V to 6 V, the third writing voltage is in a range of 4 V to 12 V, and the fifth writing voltage is in a range of 3 V to 8 V.

11. The writing method according to claim 9, wherein during the writing operation of the flash memory cell, a current flowing between the first electrode and the second electrode of the flash memory cell is controlled by controlling a current of the constant current load.

12. The writing method according to claim 9, wherein the first data and the second data are 1-bit data.

13. The writing method according to claim 9, wherein the first data and the second data are data of 2 or more bits.

14. The writing method according to claim 13, wherein, during the writing operation of the flash memory cell, different data values are written to the first storage transistor or the second storage transistor by adjusting a magnitude of a current of the constant current load, an application time of the first writing voltage, and/or a magnitude of the first writing voltage.

15. An erasing method of a flash memory cell, which comprises:
a substrate including a deep well region and a well region disposed on the deep well region;
a first storage transistor disposed on the well region and configured to store first data;
a second storage transistor disposed on the well region and configured to store second data; and
a selection transistor disposed between the first storage transistor and the second storage transistor in a horizontal direction on the well region, configured to isolate the first storage transistor and the second storage transistor and to perform a selection operation on the first storage transistor and the second storage transistor,
wherein the first storage transistor, the selection transistor and the second storage transistor are connected in series, and
wherein a source region of the first storage transistor is connected to a first electrode of the flash memory cell, and a drain region of the second storage transistor is connected to a second electrode of the flash memory cell,
the erasing method comprising a first erasing step, which comprises:
performing an erasing operation on the first storage transistor by applying a second power voltage to the well region, applying a first erasing voltage to the first electrode, applying the second power voltage to or floating the second electrode, applying a second erasing voltage to a gate electrode of the first storage transistor, by applying a third erasing voltage to a gate electrode of the selection transistor, and applying the second power voltage to or floating a gate electrode of the second storage transistor; and
performing an erasing operation on the second storage transistor by applying the second power voltage to the well region, applying the second power voltage to or floating the first electrode, applying the first erasing voltage to the second electrode, applying the second power voltage to or floating the gate electrode of the first storage transistor, applying the third erasing voltage to the gate electrode of the selection transistor, and applying the second erasing voltage to the gate electrode of the second storage transistor,
wherein the first erasing voltage is higher than a preset voltage, the second erasing voltage is equal to or lower than the second power voltage, and the third erasing voltage is equal to or lower than the second power voltage, and
wherein the preset voltage is predetermined based on a carrier barrier height at an interface between the substrate and gate dielectric stacks of the first storage transistor and the second storage transistor.

16. The erasing method according to claim 15, wherein the second power voltage is a ground voltage,
the first erasing voltage is in a range of 3 V to 8 V, and
the second erasing voltage is in a range of −8 V to 0 V.

17. The erasing method according to claim 15, further comprising a second erasing step, which comprises:
performing an erasing operation on the first storage transistor and the second storage transistor simultaneously by applying the second power voltage to the well region, applying the first erasing voltage to the first electrode and the second electrode, applying the third erasing voltage to the gate electrode of the selection transistor, and applying the second erasing voltage to the gate electrodes of the first storage transistor and the second storage transistor.

18. The erasing method according to claim 17, further comprising a third erasing step, which comprises:
performing an erasing operation on the first storage transistor by applying a fourth erasing voltage to the well region and the first electrode, applying the fourth erasing voltage to or floating the second electrode, applying a fifth erasing voltage to the gate electrode of the first storage transistor, applying the second power voltage to the gate electrode of the selection transistor, and applying the second power voltage to or floating the gate electrode of the second storage transistor; and
performing an erasing operation on the second storage transistor by applying the fourth erasing voltage to or floating the first electrode, applying the fourth erasing voltage to the well region and the second electrode, applying the second power voltage to or floating the gate electrode of the first storage transistor, applying the second power voltage to the gate electrode of the selection transistor, and applying the fifth erasing voltage to the gate electrode of the second storage transistor,
wherein the second power voltage is a ground voltage, the fourth erasing voltage is in a range of 0 V to 20 V, and the fifth erasing voltage is in a range of −10 V to 0 V.

19. The erasing method according to claim 18, further comprising a fourth erasing step, which comprises:
performing an erasing operation on the first storage transistor and the second storage transistor simultaneously by applying the fourth erasing voltage to the well region, the first electrode, and the second electrode, applying the second power voltage to the gate electrode of the selection transistor, and applying the fifth erasing voltage to the gate electrodes of the first storage transistor and the second storage transistor.

20. The erasing method according to claim 19, further comprising:

firstly performing an erasing operation on the flash memory cell by the third erasing step or the fourth erasing step, and subsequently performing an erasing operation on the flash memory cell by the first erasing step or the second erasing step.

\* \* \* \* \*